US 9,903,931 B2

(12) United States Patent
Omata et al.

(10) Patent No.: US 9,903,931 B2
(45) Date of Patent: Feb. 27, 2018

(54) DIAGNOSTIC DEVICE FOR VOLTAGE SENSORS

(71) Applicant: DENSO CORPORATION, Kariya, Aichi-pref. (JP)

(72) Inventors: Ryuji Omata, Kariya (JP); Yuri Murata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/348,687

(22) Filed: Nov. 10, 2016

(65) Prior Publication Data

US 2017/0131379 A1 May 11, 2017

(30) Foreign Application Priority Data

Nov. 10, 2015 (JP) ................................. 2015-220543

(51) Int. Cl.
*H02P 1/00* (2006.01)
*H02P 21/00* (2016.01)
(Continued)

(52) U.S. Cl.
CPC .............. *G01R 35/00* (2013.01); *B60L 11/08* (2013.01); *B60L 11/1803* (2013.01);
(Continued)

(58) Field of Classification Search
CPC .... B60L 3/0046; B60L 11/1803; B60L 15/20; B60L 3/0038; B60L 11/1861;
(Continued)

(56) References Cited

U.S. PATENT DOCUMENTS 6,795,762 B2 * 9/2004 Itoh ...................... B62D 5/0484
180/421
8,976,560 B2 * 3/2015 Nakamura ............ B60L 3/0038
363/56.05
(Continued)

FOREIGN PATENT DOCUMENTS

JP 4793058 B2 10/2011
JP 2015-091144 A 5/2015
(Continued)

*Primary Examiner* — Paul Ip
(74) *Attorney, Agent, or Firm* — Oliff PLC

(57) ABSTRACT

In a diagnostic device, a determiner determines whether a rotational speed of an AC motor is within a low rotational-speed range in which its rotational speed is approximately zero. An input-voltage estimate calculator calculates, as an input-voltage estimate, an estimate of an input voltage to an inverter when it is determined that the rotational speed of the AC motor is within the low rotational-speed range. A malfunction determiner performs a diagnostic task. The diagnostic task calculates an absolute value of a difference between an input-voltage measurement value measured by an input voltage sensor and the input-voltage estimate. The diagnostic task determines whether the absolute value of the difference is higher than a predetermined voltage threshold. The diagnostic task determines that there is a malfunction in the input voltage sensor upon determining that the absolute value of the difference is higher than the predetermined voltage threshold.

8 Claims, 10 Drawing Sheets

(51) Int. Cl.
  *G01R 35/00* (2006.01)
  *G01R 31/34* (2006.01)
  *G01R 19/10* (2006.01)
  *G01R 19/25* (2006.01)
  *H02P 27/08* (2006.01)
  *H02P 6/16* (2016.01)
  *B60L 11/08* (2006.01)
  *B60L 11/18* (2006.01)

(52) U.S. Cl.
  CPC ......... *G01R 19/10* (2013.01); *G01R 19/2503* (2013.01); *G01R 31/343* (2013.01); *H02P 6/16* (2013.01); *H02P 27/08* (2013.01)

(58) Field of Classification Search
  CPC .............. B60L 11/187; B60L 2240/421; B60L 2240/423; B60L 2240/527; B60L 2240/545; B60L 11/08; B60L 11/14; B60L 11/1851; B60L 15/16
  USPC ......... 318/139, 400.12, 400.13, 400.2, 400.3
  See application file for complete search history.

(56) References Cited

U.S. PATENT DOCUMENTS

| | | | | |
|---|---|---|---|---|
| 2003/0120407 | A1* | 6/2003 | Itoh | B62D 5/0484 |
| | | | | 701/43 |
| 2013/0141953 | A1* | 6/2013 | Nakamura | B60L 3/0038 |
| | | | | 363/74 |
| 2014/0247018 | A1* | 9/2014 | Kikuchi | H02J 7/0029 |
| | | | | 320/150 |
| 2015/0175193 | A1* | 6/2015 | Endo | B62D 5/0487 |
| | | | | 701/29.2 |
| 2017/0131378 | A1 | 5/2017 | Murata | |
| 2017/0163195 | A1 | 6/2017 | Omata et al. | |

FOREIGN PATENT DOCUMENTS

| | | |
|---|---|---|
| JP | 2017-093138 A | 5/2017 |
| JP | 2017-093150 A | 5/2017 |

\* cited by examiner

DIAGNOSTIC DEVICE FOR VOLTAGE SENSORS

CROSS REFERENCE TO RELATED APPLICATIONS

This application is based on and claims the benefit of priority from Japanese Patent Application 2015-220543 filed on Nov. 10, 2015, the disclosure of which is incorporated in its entirety herein by reference.

TECHNICAL FIELD

The present disclosure relates to diagnostic devices for voltage sensors.

BACKGROUND

There are known diagnostic devices for determining whether there is a malfunction in a voltage sensor installed in a system where a direct-current (DC) voltage output from a battery is converted by an inverter into an alternating-current (AC) voltage, and the AC voltage is supplied to an AC motor.

One of these diagnostic devices is disclosed in Japanese Patent Publication No. 4793058, which will be referred to as a conventional patent document.

The diagnostic device disclosed in the conventional patent document determines whether the absolute value of the difference between the battery voltage VBf measured by a battery voltage sensor and the inverter voltage VIf measured by an inverter input-voltage sensor is higher than a predetermined first value. Upon determining that the absolute value of the difference between the battery voltage VBf and the inverter voltage VIf is higher than the predetermined first value, the diagnostic device determines that there is a malfunction in one of the battery voltage sensor and the inverter input-voltage sensor.

The diagnostic device disclosed in the conventional patent document also obtains U-, V-, and W-phase currents flowing in an AC motor, and multiplies each of the U-, V-, and W-phase currents by a corresponding one of U-, V-, and W-phase command voltages. Then, the diagnostic device calculates, as a first output estimate, the sum of the product of the U-phase current and the U-phase command voltage, the product of the V-phase current and the V-phase command voltage, and the product of the W-phase current and the W-phase command voltage.

In addition, the diagnostic device disclosed in the conventional patent document calculates the product of request torque for the AC motor and the angular velocity of the AC motor to obtain a second output estimate accordingly.

The diagnostic device compares the first output estimate with the second output estimate to calculate the absolute value of the difference between the first and second output estimates. Then, the diagnostic device determines that there is a malfunction in the inverter input-voltage sensor when the absolute value of the difference between the first and second output estimates is higher than a predetermined second value.

SUMMARY

The diagnostic device disclosed in the conventional patent document is designed on the assumption that the AC motor is driven normally to have stable torque and stable rotational speed. In other words, the diagnostic device disclosed in the conventional patent document may erroneously determine that there is a malfunction in the inverter input-voltage sensor when the AC motor has unstable torque and unstable rotational speed.

Let us consider that the diagnostic device disclosed in the conventional patent document is applied to a motor-generator drive system for hybrid vehicles or electric vehicles. In this case, the diagnostic device applied to the motor-generator drive system is capable of performing the diagnosis of the inverter input-voltage sensor only while the AC motor is operating in a high rotational-speed range based on a high voltage input to the inverter.

In other words, the diagnostic device applied to the motor-generator drive system has difficulty in performing the diagnosis of the voltage sensors while the AC motor is operating in a low rotational-speed range in which the corresponding vehicle is stopped or the AC motor has just started up. This may lead to delay of executing the diagnosis of the voltage sensors, resulting in the occurrence of an abnormal behavior of the corresponding vehicle, such as overrunning of the corresponding vehicle.

In view of the circumstances set forth above, an aspect of the present disclosure seeks to provide diagnostic devices for an input-voltage sensor for an inverter connected to an AC motor, each of which is designed to address the problem set forth above.

Specifically, a specific aspect of the present disclosure seeks to provide such diagnostic devices, each of which is capable of diagnosing whether there is a malfunction in the input-voltage sensor even if a rotational speed of the AC motor is within a low rotational-speed range.

According to an exemplary aspect of the present disclosure, there is provided a diagnostic device applied for a motor controller that controls AC power, supplied from an inverter based on a DC voltage of a DC power source, to a multiphase AC motor having three or more phases. The diagnostic device is operative to diagnose whether there is a malfunction in an input voltage sensor that measures, as an input-voltage measurement value, an input voltage to the inverter. The diagnostic device includes a determiner configured to determine whether a rotational speed of the AC motor is within a predetermined low rotational-speed range in which the rotational speed is approximately zero. The diagnostic device includes an input-voltage estimate calculator configured to calculate, as an input-voltage estimate, an estimate of the input voltage to the inverter when it is determined that the rotational speed of the AC motor is within the predetermined low rotational-speed range. The diagnostic device includes a malfunction determiner configured to perform a diagnostic task. The diagnostic task calculates an absolute value of a difference between the input-voltage measurement value measured by the input voltage sensor and the input-voltage estimate, and determines whether the absolute value of the difference is higher than a predetermined voltage threshold. Then, the diagnostic task determines that there is a malfunction in the input voltage sensor upon determining that the absolute value of the difference is higher than the predetermined voltage threshold.

The diagnostic device according to the exemplary aspect of the present disclosure calculates, as the input-voltage estimate, the estimate of the input voltage to the inverter when it is determined that the rotational speed of the AC motor is within the predetermined low rotational-speed range in which the rotational speed is approximately zero. Then, the diagnostic device compares the input-voltage measurement value measured by the input voltage sensor with the calculated input-voltage estimate, and determines whether there is a malfunction in the input voltage sensor based on the comparison result.

The input-voltage estimate calculated when the rotational speed of the AC motor is within the predetermined low rotational-speed range has higher accuracy than the input-voltage estimate calculated when the rotational speed of the AC motor is out of the predetermined low rotational-speed range. This therefore prevents erroneous determination that there is a malfunction in the input voltage sensor even if the rotational speed of the AC motor is within the predetermined low rotational-speed range.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

The following describes embodiments of the present disclosure with reference to the accompanying drawings.

Figure 1:
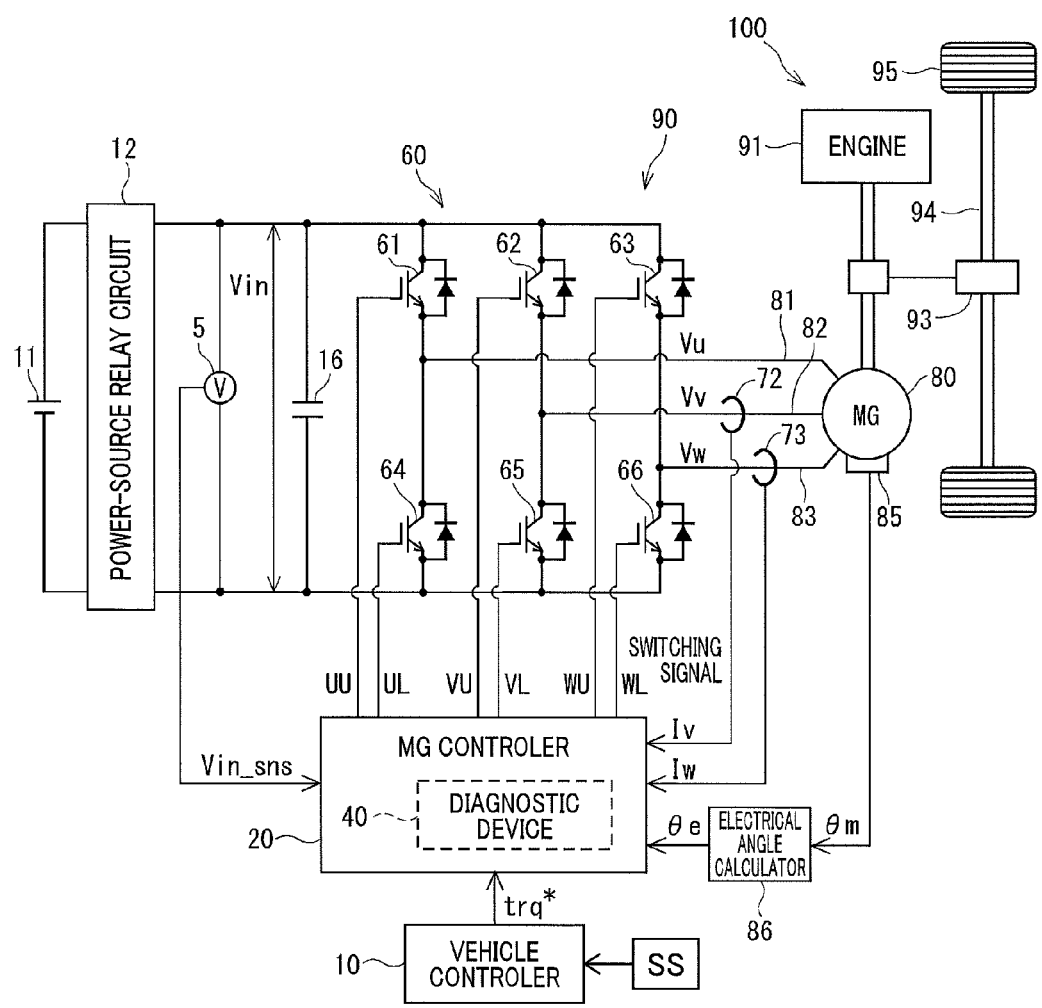
FIG. 1 is a circuit diagram schematically illustrating a motor-generator drive system installed in a vehicle according to an overall embodiment of the present disclosure.

First, the following describes an example of the common structure of diagnostic devices for diagnosing whether there is a malfunction in an input voltage sensor 5 according to the respective embodiments of the present disclosure with reference to FIG. 1.

FIG. 1 schematically illustrates a motor-generator (MG) drive system installed in a vehicle, typically a hybrid vehicle 100 equipped with an engine 91. An overall embodiment including the respective embodiments embodies a diagnostic device, which is installed in an MG drive system 90 installed in the vehicle 100, for diagnosing whether there is a malfunction in the input voltage sensor 5 for measuring an input voltage, such as an inverter input voltage, to an inverter 60.

First, the following describes the overall structure of the MG drive system 90 with reference to FIG. 1. For example, the MG drive system 90 is equipped with a single motor-generator (MG) 80.

The MG drive system 90, which is installed in the hybrid vehicle 100, includes a battery 11 as an example of direct-current (DC) power sources, and an inverter 60. The MG drive system 90 is configured such that the inverter 60 converts DC power output from the battery 11 into three-phase alternating-current (AC) voltages, and supplies the three-phase AC voltages to the MG 80, thus driving the MG 80.

The MG 80 is for example designed as a permanent magnet synchronous three-phase AC motor-generator. The MG 80 installed in the hybrid vehicle 100 is coupled to a driving axle 94 having at both ends driving wheels 95 via a gear mechanism, such as a transmission, 93. That is, the MG 80 serves as a motor in a power running mode to generate torque that rotatably drives the driving axle 94 to thereby rotatably drive the driving wheels 95 via the gear mechanism 93. The MG 80 also serves as a generator in a regenerative mode to generate electrical power based on torque transferred from the engine 91 and/or the driving wheels 95, and charge the generated electrical power to the battery 11.

The MG 80 is provided with a rotor and a stator (not shown). The rotor is provided with at least one pair of permanent magnets.

The rotor has a direct axis (d-axis) in line with a direction of magnetic flux created by an N pole of the at least one pair of permanent magnets. The rotor also has a quadrature axis (q-axis) with a phase being $\pi/2$-radian electrical angle leading with respect to a corresponding d-axis during rotation of the rotor. In other words, the q-axis is electromagnetically perpendicular to the d-axis. The d and q axes constitute a d-q coordinate system, i.e. a two-phase rotating coordinate system, defined relative to the rotor.

The stator includes a stator core such that the rotor is rotatably arranged with respect to the stator core. The stator also includes a set of three-phase windings, i.e. armature windings, 81, 82, and 83 wound in the stator core.

The three-phase, i.e. U-, V, and W-phase, windings 81, 82, and 83 are wound in the stator core such that the U-, V-, and W-phase windings 81, 82, and 83 are shifted by an electrical angle of, for example, $2\pi/3$ radian in phase from each other.

For example, the three-phase windings 81, 82, and 83 each have one end connected to a common junction, i.e. a neutral point, and the other end to a separate terminal in, for example, a star-configuration.

A chargeable DC battery, such as a nickel-hydrogen battery or a lithium-ion battery, can be used as the battery 11. An electrical double layer capacitor can also be used as the DC power source in place of the battery 11.

The MG drive system 90 includes a power-source relay circuit 12 connected between the battery 11 and the inverter 60. The power-source relay circuit 12 is operative to enable the battery 11 to supply a DC voltage to the inverter 60, and interrupt the supply of the DC voltage from the battery 11 to the inverter 60. In other words, the inverter 60 can be driven upon the power-source relay circuit 12 being turned on, i.e. closed, and cannot be driven upon the power-source relay circuit 12 being turned off, i.e. opened.

The MG drive system 90 includes a smoothing capacitor 16 connected in parallel to the battery 11 at the input side of the smoothing capacitor 16. The smoothing capacitor 16 is operative to smooth the DC voltage, i.e. an inverter input voltage Vin, output from the battery 11, so that the smoothed inverter input voltage Vin, referred to simply as the inverter input voltage Vin, is directly input to the inverter 60. That is, the MG drive system 90 includes no boosting converters between the battery 11 and the inverter 60.

The MG drive system 90 also includes the input voltage sensor 5. The input voltage sensor 5 is operative to measure the inverter input voltage Vin across the smoothing capacitor 16 as an input-voltage measurement value Vin_sns.

The inverter 60 includes switching elements 61 to 66 connected in bridge configuration, and flywheel diodes D1 to D6.

Specifically, the switching elements 61 and 64 are a pair of U-phase upper- and lower-arm switching elements connected in series to each other, and the switching elements 62 and 65 are a pair of V-phase upper- and lower-arm switching elements connected in series to each other. Additionally, the switching elements 63 and 66 are a pair of W-phase upper- and lower-arm switching elements connected in series to each other.

The switching elements 61 to 66 are for example semiconductor switching elements, such as IGBTs. The overall embodiment uses an IGBT as each of the switching elements 61 to 66.

That is, the emitter of each of the upper-arm switching elements 61 to 63 is connected to the collector of the corresponding one of the lower-arm switching elements 64 to 66.

The collectors of the switching elements 61 to 63 are commonly connected to the positive terminal of the battery 11, and the emitters of the switching elements 23a2, 23a4, and 23a6 are connected to the negative terminal of the battery 11. This results in the first pair of switching elements 61 and 64, the second pair of switching elements 62 and 65, and the third pair of switching elements 63 and 66 being connected in parallel to the battery 11.

The connection point between the U-phase upper- and lower-arm switching elements 61 and 64 is connected to the separate terminal of the U-phase winding 81, and the connection point between the V-phase upper- and lower-arm switching elements 62 and 65 is connected to the separate terminal of the V-phase winding 82. Additionally, the connection point between the W-phase upper- and lower-arm switching elements 63 and 66 is connected to the separate terminal of the W-phase winding 83.

Each of the flywheel diodes D1 to D6 is connected in antiparallel to a corresponding one of the switching elements 61 to 66. Each of the flywheel diodes D1 to D6 allows a current to flow from the low-potential side, i.e. emitter side, to the high-potential side, i.e. the collector side.

The gates of the switching elements 61 to 66 are connected to the MG controller 20. The upper- and lower-arm switching elements of each pair are complementarily turned on under control of the MG controller 20.

The MG drive system 90 includes a vehicle controller 10, an MG controller 20, current sensors 72 and 73, a rotational angle sensor 85, and an electrical angle calculator 86.

The current sensors 72 and 73 are respectively provided for two connection lines between two-phase windings in the three-phase windings 81, 82, and 83 and the inverter 60, and are operative to measure corresponding phase currents flowing through the two-phase windings. For example, the current sensors 72 and 73 illustrated in FIG. 1 are respectively provided for two connection lines between the inverter 60 and the V- and W-phase windings 82 and 83. The current sensors 72 and 73 are operative to measure V- and W-phase currents Iv and Iw flowing through the respective V- and W-phase windings 82 and 83.

The rotational angle sensor 85 includes, for example, a resolver. The rotational angle sensor 85 is disposed to be adjacent to, for example, the rotor of the MG 80, and is connected to the electrical angle calculator 86. The rotational angle sensor 85 is configured to measure, i.e. monitor, a resolver angle $\theta$m based on a rotational electrical angle $\theta$e of the rotor of the MG 80, and output the resolver angle $\theta$m to the electrical angle calculator 86. The electrical angle calculator 86 is configured to calculate the rotational electrical angle $\theta$e of the rotor of in accordance with the resolver angle $\theta$m.

Note that FIG. 1 illustrates the electrical angle calculator 86 located outside of the MG controller 20, but can be installed as a hardware or software module in the MG controller 20 for calculating the rotational electrical angle $\theta$e of the rotor of in accordance with the resolver angle $\theta$m.

The vehicle controller 10, i.e. an electronic control unit (ECU) for the hybrid vehicle 100, is designed as, for example, a microcomputer circuit. Specifically, the vehicle controller 10 essentially includes, for example, a CPU, a memory, such as a ROM and/or a RAM, an I/O interface, and a bus connecting between the CPU, memory, and I/O interface. The vehicle controller 10 can include at least one special-purpose electronic circuit. Specifically, the vehicle controller 10 is configured such that the CPU performs instructions of programs stored in the memory, thus performing predetermined software tasks associated with the hybrid vehicle 100. The vehicle controller 10 can also be configured such that the at least one special-purpose electronic circuit performs predetermined hardware tasks associated with the hybrid vehicle 100. The vehicle controller 10 can be configured to perform both the software tasks and the hardware tasks.

Various sensors and switches SS indicative of the driving conditions of the hybrid vehicle 100 are installed in the hybrid vehicle 100. The sensors and switches SS include, for example, an accelerator sensor, a vehicle speed sensor, a crank angle sensor, a brake switch, and a shift switch.

The accelerator sensor is operative to detect a position or stroke of a driver-operable accelerator pedal of the hybrid vehicle 100, and output an accelerator signal indicative of the measured driver's operated position or stroke of the accelerator pedal to the vehicle controller 10.

The vehicle speed sensor is operative to measure the speed of the hybrid vehicle 100, and operative to output, to the vehicle controller 10, a vehicle-speed signal indicative of the measured speed of the hybrid vehicle 100.

The brake switch is operative to, for example, detect whether a brake pedal of the hybrid vehicle 100 is operated, and output, to the vehicle controller 10, a brake signal when it is determined that the brake pedal is operated.

The shift switch is operative to detect a driver's selected gear ratio of the gear mechanism 93 installed in the hybrid vehicle 100, and output a shift signal indicative of the driver's selected gear ratio to the vehicle controller 10.

The vehicle controller 10 receives the signals sent from the sensors and/or switches SS, and information from unillustrated other ECUs including an engine ECU for controlling the engine 91 and a battery ECU for controlling the battery 11. Then, the vehicle controller 10 detects the driving conditions of the hybrid vehicle 100 based on the received signals, and perform, based on the driving conditions of the hybrid vehicle 100, the above software and/or hardware tasks for controlling how the hybrid vehicle 100 is driven.

The vehicle controller 10 also generates a value of request torque trq* for the MG 80 according to the detected driving conditions of the hybrid vehicle 100. Then, the vehicle controller 10 outputs the value of the request torque trq* to the MG controller 20.

Like the vehicle controller 10, each of the other ECUs is designed as, for example, a microcomputer circuit. Specifically, each of the other ECUs essentially includes, for example, a CPU, a memory, such as a ROM and/or a RAM, an I/O interface, and a bus connecting between the CPU, memory, and I/O interface. Each of the other ECUs can include at least one special-purpose electronic circuit. Specifically, each of the other ECUs is configured such that the CPU performs instructions of programs stored in the memory, thus performing predetermined software tasks associated with the corresponding target to be controlled. Each of the other ECUs can also be configured such that the at least one special-purpose electronic circuit performs predetermined hardware tasks associated with the corresponding target to be controlled. Each of the other ECUs can be configured to perform both the software tasks and the hardware tasks.

The MG controller 20 is designed as, for example, a microcomputer circuit. Specifically, the MG controller 20 essentially includes, for example, a CPU, a memory, such as a ROM and/or a RAM, an I/O interface, and a bus connecting between the CPU, memory, and I/O interface.

The MG controller 20 performs a known current-feedback control task, which uses a modulation factor, i.e. a modulation ratio, M of the inverter 60, based on the request torque trq*, thus calculating voltage commands. Then, the MG controller 20 generates switching signals, i.e. drive signals, UU, UL, VU, VL, WU, and WL for the respective switching elements 61, 64, 62, 65, 63, and 66. Then, the MG controller 20 outputs the drive signals, UU, UL, VU, VL, WU, and WL to the gates of the respective switching elements 61, 64, 62, 65, 63, and 66, thus controlling on-off operations of each of the switching elements 61, 64, 62, 65, 63, and 66. This controls energization of the MG 80 to cause output torque of the MG 80 to follow the request torque trq*.

When calculating the modulation factor M of the inverter 60, the MG controller 20 uses the input-voltage measurement value Vin_sns measured by the input voltage sensor 5. If there were a malfunction in the input voltage sensor 5 so that the input-voltage measurement value Vin_sns were deviated from its real value, the MG controller 20 might not perform proper energization control of the MG 80.

For addressing the problem, the MG controller 20 includes a diagnostic device 40 for diagnosing whether there is a malfunction in the input voltage sensor 5.

In particular, the diagnostic device 40 according to the overall embodiment is specially configured to diagnose whether there is a malfunction in the input voltage sensor 5 while the MG 80 is operating in a low rotational-speed range in which the rotational speed of the MG 80 is zero or a value substantially equal to zero. In other words, the diagnostic device 40 according to the overall embodiment is specially configured to diagnose whether there is a malfunction in the input voltage sensor 5 while the MG 80 is operating in a low rotational-speed range in which the MG 80 is approximately stopped.

Malfunctions, i.e. abnormalities, in common voltage sensors include freezing of the output value of a voltage sensor to its lower limit or upper limit. Such a malfunction can be determined based on known technologies. Malfunctions in common voltage sensors also include an output-characteristic malfunction in a voltage sensor, such as a gain malfunction or an offset malfunction. Such an output-characteristic abnormality in a voltage sensor may result in the output value of the voltage sensor being deviated from its real value by, for example, a value within the range from several percent to several dozens of percent. It has been difficult to determine whether there is such an output-characteristic malfunction in a voltage sensor.

In view of these circumstances, the diagnostic device 40 aims to diagnose whether there is an output-characteristic malfunction, such as a gain malfunction or an offset malfunction, in the input voltage sensor 5.

The following describes in detail the specific structure and operations of the MG controller 20 according to each of the first and second embodiments included in the overall embodiment. Note that reference numerals 201 and 401 are assigned to the MG controller 20 and the diagnostic device 40 according to the first embodiment, and reference numerals 202 and 402 are assigned to the MG controller 20 and the diagnostic device 40 according to the second embodiment.

First Embodiment

Figure 2:
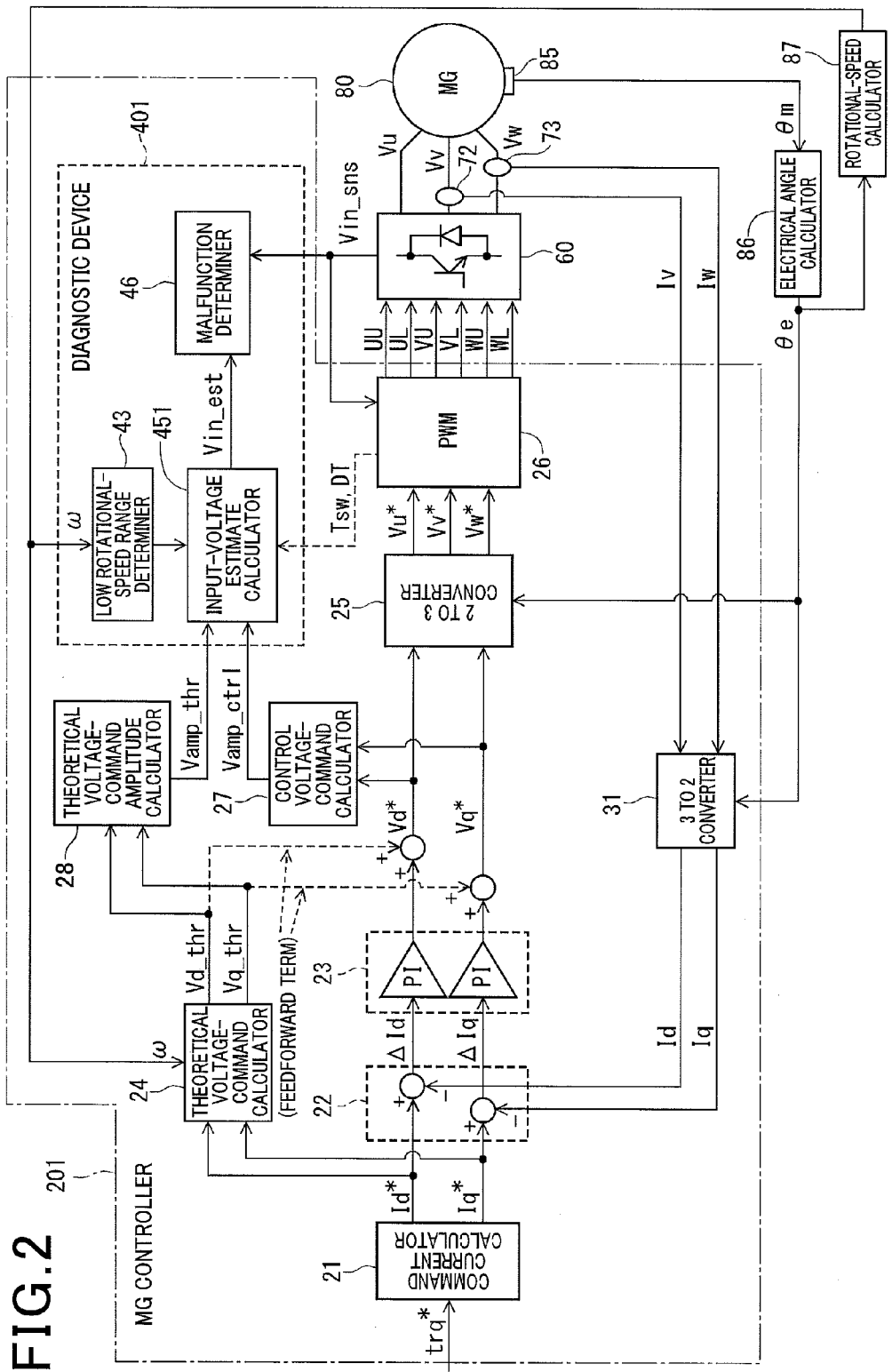
FIG. 2 is a block diagram schematically illustrating the structures of an MG controller and a diagnostic device illustrated in FIG. 1 according to the first embodiment of the present disclosure.

FIG. 2 schematically illustrates the structures of the MG controller 201 and the diagnostic device 401 according to the first embodiment.

The MG controller 201 includes a known functional structure to cyclically perform a common current feedback control task and a PWM control task. The known functional structure includes a command current calculator 21, a command current subtractor 22, a voltage command calculator 23, a two-phase to three-phase converter (2 TO 3 CONVERTER in FIG. 2) 25, a PWM signal generator 26, and a three-phase to two-phase converter (3 TO 2 CONVERTER in FIG. 2) 31.

Additionally, the MG controller 201 includes a specific functional structure according to the first embodiment; the specific functional structure includes a theoretical voltage-command calculator 24, a control voltage-command amplitude calculator 27, and a theoretical voltage-command amplitude calculator 28.

The above functional modules included in the MG controller 201 can be implemented as hardware modules, software modules, and/or hardware-software hybrid modules. The modules 24, 27, and 28 are illustrated to be outside of the diagnostic device 401, but at least part of the functions of the modules 24, 27, and 28 can be included in the diagnostic device 401.

Specifically, the MG controller 21 performs the current feedback control task and the PWM control task to thereby control on-off operations of the switching elements 61 to 66 of the inverter 60. The current feedback control task performs a vector control task based on the d-q coordinate system. Because these tasks for controlling energization of the MG 80 are known in ordinary skilled persons in the art, the following describes these tasks in a simplified manner.

First, the following describes the functional modules to implement the common current feedback control task and PWM control task.

The three-phase to two-phase converter 31 calculates a U-phase current Iu based on the V- and W-phase currents Iv and Iw, which are input thereto from the respective current sensors 72 and 73, in accordance with Kirchhoff's law. Then, the three-phase to two-phase converter 31 converts the three-phase currents Iu, Iv and Iw into d- and q-axis currents Id and Iq using the rotational electrical angle θe and, for example, a known conversion equation or map. Thereafter, the three-phase to two-phase converter 31 feeds the three-phase currents Iu, Iv and Iw back to the command current subtractor 22.

Note that the first embodiment measures the V- and W-phase currents Iv and Iw, and calculates the remaining U-phase current Iu, but the other embodiments can measure any two phase currents, or measure all three-phase currents Iu, Iv and Iw. Each of the embodiments can use a single current sensor provided for one phase winding, and estimate, based on a value of a corresponding one-phase current measured by the single current sensor, values of the remaining two phase currents.

The command current calculator 21 calculates a d-axis current command id* and a q-axis current command iq* in the d-q coordinate system of the rotor of the MG 80 according to the value of request torque trq* for the MG 80 supplied from the vehicle controller 10. The command d-axis current id* and command q-axis current iq* are required to obtain torque of the MG 80 matching with the value of the request torque trq*.

For example, the command current calculator 21 has a map in data-table format, in mathematical expression format, and/or program format. The map includes information indicative of a relationship between values of each of the d-axis current command Id* and the q-axis current command Iq*, and values of the request torque trq*. Specifically, the command current calculator 21 refers to the map, and extracts a value of each of the d-axis current command Id* and the q-axis current command Iq* corresponding to the input value of the request torque trq*. Note that a d-axis current and a q-axis current will be simply described as d-q axis currents hereinafter.

The command current subtractor 22 includes a first subtractor 22a and a second subtractor 22b. The first subtractor 22a subtracts the d-axis current Id fed back from the three-phase to two-phase converter 31 from the d-axis current command Id* to thereby calculate a d-axis current deviation ΔId. The second subtractor 22b subtracts the q-axis current value Iq fed back from the three-phase to two-phase converter 31 from the q-axis current command Iq* to thereby calculate a q-axis current deviation ΔIq.

The voltage command calculator 23 performs a proportional-integral (PI) feedback operation using the d-axis current deviation ΔId as input data, and a proportional gain term and an integral gain term of a PI feedback control algorithm (PI algorithm). The PI feedback operation calculates a sinusoidal d-axis voltage command Vd* such that the d-axis current deviation ΔId converges to zero, thus causing the d-axis current Id to follow the d-axis current command id*.

The voltage command calculator 23 also performs a PI feedback operation using the q-axis current deviation ΔIq as input data, and a proportional gain term and an integral gain term of a PI feedback control algorithm (PI algorithm). The PI feedback operation calculates a sinusoidal q-axis voltage command Vq* such that the q-axis current deviation ΔIq converges to zero, thus causing the q-axis current Iq to follow the q-axis current command Iq*.

To the two-phase to three-phase converter 25, the d-axis voltage command Vd* and q-axis voltage command Vq* calculated by the voltage command calculator 23, and the rotational electrical angle θe of the MG 80 are input.

Then, the two-phase to three-phase converter 25 converts the d-axis voltage command Vd* and q-axis voltage command Vq* into three-phase sinusoidal voltage commands Vu*, Vv*, and Vw* using the rotational electrical angle θe and, for example, map data or equation data. The map data or equation data represents correlations between values of the three-phase sinusoidal voltage commands Vu*, Vv*, and Vw*, values of the d-axis voltage command Vd* and q-axis voltage command Vq*, and values of the rotational electrical angle θe.

The PWM-signal generator 26 calculates, based on the three-phase sinusoidal voltage commands Vu*, Vv*, and Vw* and the input-voltage measurement value Vin_sns, the switching signals (drive signals) UU, UL, VU, VL, WU, and WL for the respective switching elements 61, 64, 62, 65, 63, and 66 of the inverter 60.

Specifically, the PWM-signal generator 26 calculates the modulation factor M of the inverter 60 based on the inverter input-voltage measurement value Vin_sns and the d- and q-axis voltage commands Vd* and Vq* in accordance with the following equation [A]:

$$M = 2\sqrt{\frac{2}{3}} \frac{Vr}{Vin\_sns} \quad [A]$$

Where Vr represents the magnitude of the voltage vector of the d- and q-axis voltage commands Vd* and Vq* in the d-q coordinate system.

When the modulation factor M is set to be greater than 0 and smaller than 1.27, the PWM-signal generator 26 selects the known sinusoidal PWM control mode or the known over-modulation control mode.

The following describes the sinusoidal PWM control mode in a simplified manner.

In the sinusoidal PWM control mode, the PWM-signal generator 26 performs the PWM control task that multiplies each of the three-phase sinusoidal voltage commands Vu*, Vv*, and Vw* by the modulation factor M at a present switching period Tsw to calculate a duty factor, i.e. a duty cycle, Duty for each phase at a present switching period Tsw. The duty cycle Duty represents a controllable ratio, i.e.

percentage, of an on duration to a total duration of a present switching period Tsw for each of the switching elements 61 to 66.

Then, the PWM control task compares the duty factor Duty for each of the switching elements 61 to 66 with a cyclical (periodical) carrier signal, i.e. a cyclically triangular carrier signal; the switching period Tsw corresponds to the cycle, i.e. period of the carrier signal.

Then, the PWM control task generates, based on the comparison results, PWM pulse signals, i.e. switching signals UU, UL, VU, VL, WU, and WL; each of the PWM pulse signals includes the corresponding one of the duty factors Duty. Then, the PWM control task outputs the switching signals UU, UL, VU, VL, WU, and WL to the respective switching elements 61, 64, 62, 65, 63, and 66. This changes on-pulse widths and off-pulse widths of the switching elements 61 to 66 for each phase such that the fundamental component of the output voltage, i.e. the line-to-line voltage, of the inverter 60 has a pseudo sinusoidal waveform.

Because the over-modulation PWM control mode is known in various conventional documents and similar to the sinusoidal PWM control mode, the descriptions of the over-modulation PWM control mode are omitted. Note that, in the sinusoidal PWM control mode, the amplitude of each of the three-phase sinusoidal voltage commands Vu*, Vv*, and Vw* is higher than the amplitude of the carrier signal. This results in a line-to-line voltage output from the inverter 60 to be applied to the motor-generator 30 has a distorted sinusoidal waveform.

Note that, when the modulation factor M is set to 1.27, the MG controller 201 selects the known rectangular control mode. In the rectangular control mode, the MG controller 201 applies a rectangular AC voltage for each phase as a corresponding line-to-line rectangular voltage to the MG 80. Specifically, an on-off pulse pattern of each of the switching elements 61 to 66 is designed such that the ratio of on duration to an off duration for each of the switching elements are set to 1:1.

Usual switching control of an inverter outputs switching signals that complementarily turn on upper- and lower-arm switching elements of each pair while dead times during which the upper- and lower-arm switching elements of each pair are simultaneously turned off are ensured. Introducing the dead times prevents the upper and lower-arm switching elements of each pair from being simultaneously on, thus preventing an overcurrent from flowing through the upper- and lower-arm switching elements.

Figure 3:
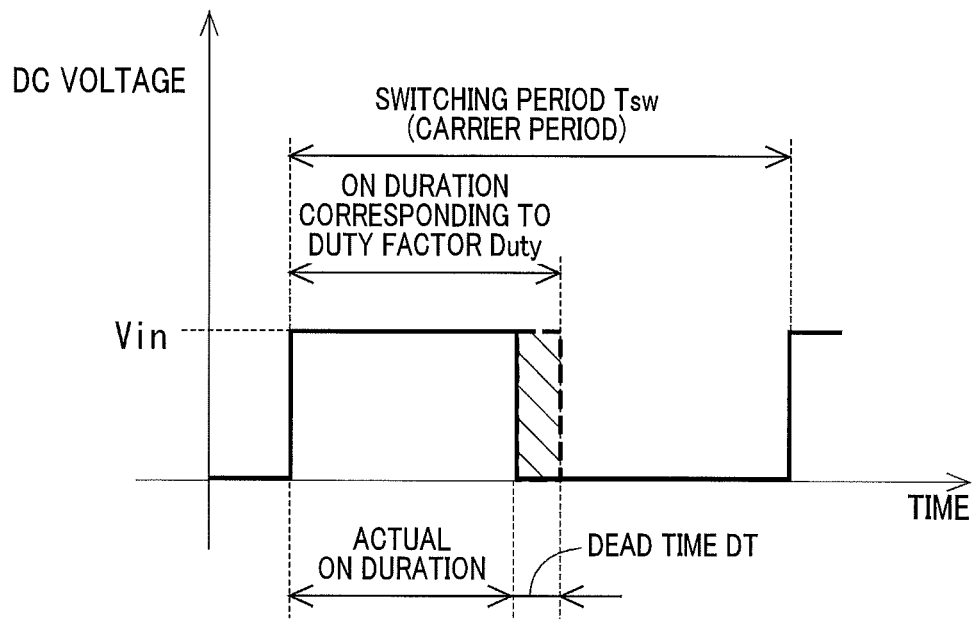
FIG. 3 is a graph schematically illustrating an example of the relationship between an input voltage to an inverter illustrated in FIG. 1 and a duty factor in a switching period according to the first embodiment.

FIG. 3 illustrates an example of the relationship between the input voltage Vin to the inverter 60 and the duty factor Duty in a switching period Tsw. In the PWM control task, the switching period Tsw matches with the cycle of the carrier signal. The actual on duration in the switching period Tsw is shorter by a dead time DT than the on duration based on the duty factor Duty. In FIG. 3, the hatched area represents the product of the dead time DT and the inverter input voltage Vin.

The current-feedback control task is configured to calculate the duty factor Duty for each switching element to correct the voltage difference caused by the dead time DT. The dead-time correction amount V_dead of the duty factor Duty is expressed by the following equation [1]:

$$V\_dead = \sqrt{3} \times (DT/Tsw) \times Vin \qquad [1]$$

Where the coefficient ($\sqrt{3}$) is determined based on the number of phases of the AC motor 80 being three.

The MG controller 201 according to the first embodiment focuses on the dead-time correction amount V_dead to calculate an input-voltage estimate Vin_est, and determined whether there is a malfunction in the input voltage sensor 5 using the input-voltage estimate Vin_est. The detailed operations of the malfunction determination will be described later.

Next, the following describes the functional modules to implement the specific functional structure according to the first embodiment.

The theoretical voltage-command calculator 24 calculates a theoretical d-axis voltage command Vd_thr and a theoretical q-axis voltage command Vq_thr in accordance with the following voltage equations [2.1] and [2.2] as the known motor model equations:

$$Vd = R \times Id + Ld \times (d/dt) \times Id - \omega \times Lq \times Iq \qquad [2.1]$$

$$Vq = R \times Iq + Lq \times (d/dt) \times Iq + \omega \times Ld \times Id + \omega \times \phi \qquad [2.2]$$

Where:

R represents the resistance of each phase winding, referred to as a winding resistance Ld represents the inductance in the d-axis, referred to as a d-axis inductance Lq represents the inductance in the q-axis, referred to as a q-axis inductance ω represents the electrical angular velocity or rotational speed of the rotor of the MG 80

φ represents a back-emf constant.

The reference character ω originally means the electrical angular velocity in radian per second [rad/s]. A rotational-speed calculator 87 temporally differentiates the electrical angle θe of the MG 80, thus calculating the electrical angular velocity ω

The specification also describes the electrical angular velocity ω [rad/s] as a rotational speed ω that means revolutions per minute [1/m], i.e. [rpm]. Note that FIG. 2 illustrates the electrical angle calculator 86 and the rotational-speed calculator 87 located outside of the MG controller 201, but can be installed as a hardware or software module in the MG controller 201.

Predetermined constant values can be used as the values of the motor constants, i.e. the winding resistance R, the d-axis inductance Ld, and the q-axis inductance Lq. In addition, the values of the winding resistance R, the d-axis inductance Ld, and the q-axis inductance Lq can be calculated by the MG controller 201. Additionally, the MG controller 201 has a map in data-table format, in mathematical expression format, and/or program format. The map includes information indicative of a relationship between (1) Actually measured or estimated values of each of the winding resistance R, the d-axis inductance Ld, and the q-axis inductance Lq, and (2) Values of the request torque trq* or the set of the d- and q-axis current commands Id* and Iq*.

Specifically, the MG controller 201 refers to the map, and extracts a value of each of the winding resistance R, the d-axis inductance Ld, and the q-axis inductance Lq corresponding to the actual value of the request torque trq* or actual values of the d- and q-axis current commands Id* and Iq*.

Ignoring the time-derivative term (d/dt), which represents transient characteristics, in the equations [2.1] and [2.2], and using the d- and q-axis current commands Id* and Iq* in place of the d- and q-axis currents Id and Iq develops the following equations [3.1] and [3.2]:

$$Vd\_thr = R \times Id^* - \omega \times Lq \times Iq^* \quad [3.1]$$

$$Vq\_thr = R \times Iq^* + \omega \times Ld \times Id^* + \omega \times \phi \quad [3.2]$$

Where Vd_thr represents the theoretical d-axis voltage command set forth above, and Vq_thr represents the theoretical q-axis voltage command set forth above.

In other words, the theoretical d-axis voltage command Vd_thr is a d-axis voltage command calculated by the equation [3.1], and the theoretical q-axis voltage command Vq_thr is a q-axis voltage command calculated by the equation [3.2].

Additionally, as described above, the diagnostic device 40 performs diagnosis of whether there is a malfunction in the input voltage sensor 5 while the MG 80 is operating in the low rotational-speed range in which the rotational speed ω of the MG 80 is zero or a value substantially equal to zero.

Thus, when the rotational speed ω is approximately equal to 0 [rad/s] in the equations [3.1] and [3.2], the following equations [3.3] and [3.4] are established in which the theoretical d- and q-axis voltage commands Vd_thr and Vq_thr are expressed by only the term of the winding resistance R:

$$Vd\_thr = R \times Id^* \quad [3.3]$$

$$Vq\_thr = R \times Iq^* \quad [3.4]$$

It is preferable that the q-axis current command Iq* is set to be approximately zero, i.e. nearly zero, if the MG 80 is maintained to be stopped during the diagnosis of the input voltage sensor 5. This setting enables the theoretical q-axis voltage command Vq_thr to become approximately zero.

The theoretical voltage-command amplitude calculator 28 obtains the theoretical d- and q-axis voltage commands Vd_thr and Vq_thr calculated by the theoretical voltage-command calculator 24.

In addition, as illustrated by dashed lines, the MG controller 201 can include adders AD1 and AD2 to which the theoretical d- and q-axis voltage commands Vd_thr and Vq_thr are respectively input. The adders AD1 and AD2 are interposed between the voltage command calculator 23 and the two-phase to three-phase converter 25. That is, the adders AD1 and AD2 adds, as a feedforward (FF) term, each of the theoretical d- and q-axis voltage commands Vd_thr and Vq_thr to the corresponding one of the d-axis voltage command Vd* and q-axis voltage command Vq* which are respectively feedback terms.

The control voltage-command amplitude calculator 27 calculates, based on the d- and q-axis voltage commands Vd* and Vq*, an amplitude of a control voltage command, referred to as a control voltage-command amplitude Vamp_ctrl in accordance with the following equation [4.1]:

$$V\text{amp\_ctrl} = \sqrt{(Vd^{*2} + Vq^{*2})} \quad [4.1]$$

The control voltage-command amplitude Vamp_ctrl shows the length of a control voltage-command vector (Vd*, Vq*) in the d-q coordinate system.

Similarly, the theoretical voltage-command amplitude calculator 28 calculates the amplitude Vamp_thr as the length of the vector defined based on the theoretical d- and q-axis voltage commands Vd_thr and Vq_thr that can be used as the feedforward terms in accordance with the following equation [4.2]:

$$V\text{amp\_thr} = \sqrt{(Vd\_thr^2 + Vq\_thr^2)} \quad [4.2]$$

The amplitude Vamp_thr will be referred to as a theoretical voltage-command amplitude.

The theoretical voltage-command amplitude Vamp_thr shows the length of a theoretical voltage-command vector (Vd_thr, Vq_thr) in the d-q coordinate system.

Figure 4:
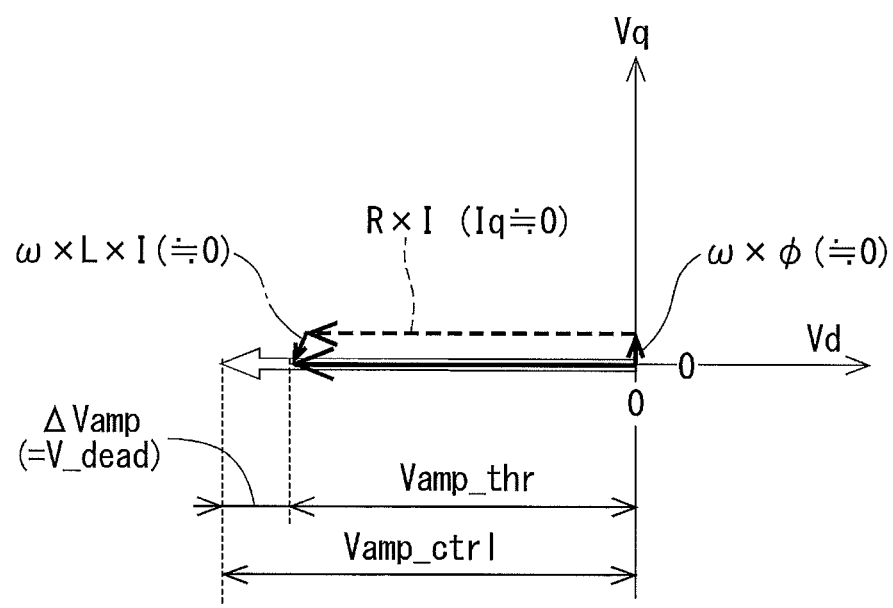
FIG. 4 is a graph schematically illustrating a vector diagram representing a control voltage-command vector and a theoretical voltage-command vector in a d-q coordinate system in a low rotational-speed range according to the first embodiment.

FIG. 4 illustrates a vector diagram representing the control voltage-command vector (Vd*, Vq*) as a heavy solid arrow and the theoretical voltage-command vector (Vd_thr, Vq_thr) as a hollow arrow in the d-q coordinate system in the low rotational-speed range.

Normal theoretical voltage-command vectors are expressed as a resultant vector of 1. A back-emf vector (ω×φ) corresponding to the third term in the equation [3.2]
2. A winding resistance vector (R×I) corresponding to the first term of each of the equations [3.1] and [3.2]
3. A synchronous inductance vector (ω×Ld×I) corresponding to the second term of each of the equations [3.1] and [3.2].

Note that the vector I represents a current command vector based on the d- and q-axis current commands Id* and Iq*. In particular, as seen in the equations [3.3] and [3.4], the winding resistance vector (R×I) has a predominance position in the resultant vector in the low rotational-speed range.

When the q-axis current command Iq* is set to be approximately zero, the theoretical voltage-command vector is expressed by a d-axis component, and the magnitude of the theoretical voltage-command vector corresponds to the theoretical voltage-command amplitude Vamp_thr.

The control voltage-command vector and the theoretical voltage-command vector have the same phase, and the control voltage-command amplitude Vamp_ctrl is slightly greater than the theoretical voltage-command amplitude Vamp_thr.

The following describes the deviation obtained by subtracting the theoretical voltage-command amplitude Vamp_thr from the control voltage-command amplitude Vamp_ctrl as a voltage-command amplitude deviation ΔVamp. If the input voltage sensor 5 is operating normally so that the current-feedback control task is carried out properly, we estimate that the factor, which causes the voltage-command amplitude deviation ΔVamp, is only the voltage differences based on the dead times DT. This leads to the fact that the voltage-command amplitude deviation ΔVamp is identical to the dead-time correction amount V_dead as expressed by the following equation [5]:

$$\Delta V\text{amp} = V\text{amp\_ctrl} - V\text{amp\_thr} = V\_\text{dead} \quad [5]$$

Next, the following describes the configuration of the diagnostic device 401.

Referring to FIG. 2, the diagnostic device 401 includes a low rotational-speed range determiner 43, an input-voltage estimate calculator 451, and a malfunction determiner 46. In FIG. 2, the input-voltage estimate is described as a Vin estimate.

The rotational-speed range determiner 43 determines whether the rotational speed ω calculated by the rotational-speed calculator 87 is within the low rotational-speed range in which the rotational speed ω is approximately zero. The rotational-speed range determiner 43 sends, to the input-voltage estimate calculator 451, low rotational-speed range information when determining that the rotational speed ω is within the low rotational-speed range. The first embodiment for example defines that the low rotational-speed range is a range in which the rotational speed ω is lower than 100 rpm.

When the low rotational-speed range information is sent thereto from the rotational-speed range determiner 43, the input-voltage estimate calculator 451 calculates the input-voltage estimate Vin_est that is an estimate of the inverter input voltage Vin.

Specifically, the input-voltage estimate calculator 451 obtains the control voltage-command amplitude Vamp_ctrl from the control voltage-command amplitude calculator 27, and obtains the theoretical voltage-command amplitude Vamp_thr from the theoretical voltage-command amplitude calculator 28.

Assigning the equation [5] to the equation [1] to transform the equation [1] establishes the following equation [6.1]:

$$\text{Vin\_est} = \frac{Tsw}{\sqrt{3} \times DT} \times (\text{Vamp\_ctrl} - \text{Vamp\_thr}) \quad [6.1]$$

Using a transform coefficient K enables the equation [6.1] to be transformed into the following equation [6.2]:

$$V\text{in\_est} = K \times \Delta V\text{amp} \quad [6.2]$$

Where K is expressed by the following equation [6.3]:

$$K = \frac{Tsw}{\sqrt{3} \times DT} \quad [6.3]$$

The switching period Tsw and the dead time DT can be respectively taken as constant values in the low rotational-speed range.

The input-voltage estimate calculator 451 is therefore capable of calculating the input-voltage estimate Vin_est in accordance with the equation [6.2] using a predetermined constant as the transform coefficient K.

Alternately, the input-voltage estimate calculator 451 can obtain the switching period Tsw and the dead time DT from the PWM signal generator 26, and calculate the input-voltage estimate Vin_est in accordance with the equations [6.2] and [6.3] using the obtained switching period Tsw and the dead time DT.

Specifically, the input-voltage estimate calculator 451 according to the first embodiment subtracts the theoretical voltage-command amplitude Vamp_thr from the control voltage-command amplitude Vamp_ctrl to obtain the voltage-command amplitude deviation $\Delta$Vamp. Then, the input-voltage estimate calculator 451 multiplies the voltage-command amplitude deviation $\Delta$Vamp by the transformation coefficient K, thus calculating the input-voltage estimate Vin_est.

The malfunction determiner 46 obtains the input-voltage measurement value Vin_sns from the input voltage sensor 5, and obtains the input-voltage estimate Vin_est from the input-voltage estimate calculator 451. Then, the malfunction determiner 46 determines whether the absolute value of the difference between the input-voltage measurement value Vin_sns and the input-voltage estimate Vin_est is higher than a predetermined voltage threshold Vth. Upon determining that the absolute value of the difference between the input-voltage measurement value Vin_sns and the input-voltage estimate Vin_est is higher than a predetermined voltage threshold Vth, the malfunction determiner 46 determines that there is a malfunction in the input voltage sensor 5. After the determination there is a malfunction in the input voltage sensor 5, the malfunction determiner 46 generates a malfunction signal.

Figure 5:
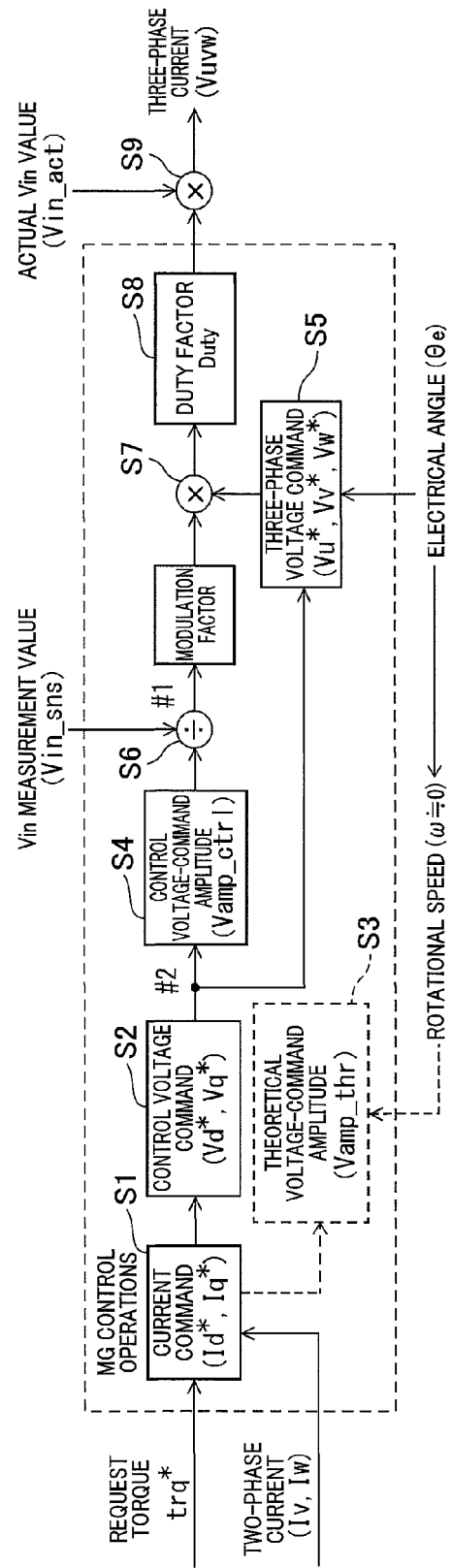
FIG. 5 is a block diagram schematically illustrating the flow of operations carried out by the MG controller according to the first embodiment.

Next, the following describes an example of the flow of the above MG control operations carried out by the MG controller 201 with reference to FIG. 5. Note that FIG. 2 illustrates the individual functions of the respective modules of the MG controller 201, but FIG. 5 illustrates the flow of the MG control operations while focusing on the feedback variables. The operations in the dashed block in FIG. 2 represent the operations by the MG controller 201.

In the current-feedback control task, the d- and q-axis current commands id* and iq* are calculated based on the request torque trq* in step S1, and the d- and q-axis control voltage commands Vd* and Vq* are calculated based on the d- and q-axis current commands id* and iq* and the d- and q-axis currents Id and Iq fed back from the MG 80 in step S2.

In a malfunction diagnostic task parallel to the current-feedback control task, the theoretical voltage-command amplitude Vamp_thr is calculated based on the d- and q-axis current commands id* and iq* and the rotational speed $\omega$ that is approximately zero in step S3.

In the current-feedback control task, the control voltage-command amplitude Vamp_ctrl is divided by the inverter input-voltage measurement value Vin_sns, so that the modulation factor M is calculated in accordance with the equation [A] in step S4.

The position of step S4 is marked by #1 in FIG. 5. In addition, the control voltage-command amplitude Vamp_ctrl changes to positively correlate with change of the d- and q-axis control voltage commands Vd* and Vq* at #2 in FIG. 5. Reference numerals #1 and #2 are identifiers referenced by the later operations.

Three-phase voltage commands Vu*, Vv*, and Vw* are calculated based on the d- and q-axis voltage commands d* and Vq* and the electrical angle $\theta$e in step S5. The operation in step S5 includes the phase of the voltage vector (d*, q*) in the d-q coordinate system, which will be referred to as a voltage phase V$\Psi$.

Multiplying each of the three-phase voltage commands Vu*, Vv*, and Vw* by the modulation factor M for each switching period Tsw enables the duty factor Duty for each of the three-phase voltage commands Vu*, Vv*, and Vw* at a present switching period Tsw to be calculated.

The inverter 60 calculates the product of an actual voltage Vin_act actually input thereto and the duty factor Duty for each phase at the present switching period Tsw, thus generating three-phase voltages Vu, Vv, and Vw to be supplied to the MG 80 in step S7.

Next, the following describes the technical concept of each of the control voltage-command amplitude Vamp_ctrl and the theoretical voltage-command amplitude Vamp_thr.

The control voltage-command amplitude Vamp_ctrl corresponds to the amplitude of each of the sinusoidal d- and q-axis voltage commands Vd* and Vq* generated by the current-feedback control task. The control voltage-command amplitude Vamp_ctrl is automatically corrected based on the dead-time correction amount V_dead without being based on the input-voltage measurement value V_in sns.

The theoretical voltage-command amplitude Vamp_thr corresponds to the amplitude of each of the theoretical d- and q-axis voltage commands Vd_thr and $V_{d\_}$thr calculated based on the known voltage equations, i.e. motor model equations [2.1] and [2.2] without being based on the input-voltage measurement value V_in sns and the dead-time correction amount V_dead.

Note that the dead-time correction amount V_dead is calculated under the assumption that the MG 80 is prevented from being rotated, i.e. the condition that the rotational speed $\omega$ of the MG 80 is approximately zero and the request torque trq* is set to zero can be previously determined by, for example, experiments and/or simulations. This modification enables the input-voltage estimate calculator 451 to calculate, based on the predetermined dead-time correction amount V_dead and the transform coefficient K, the input-voltage estimate Vin_est with higher accuracy.

Figure 6:
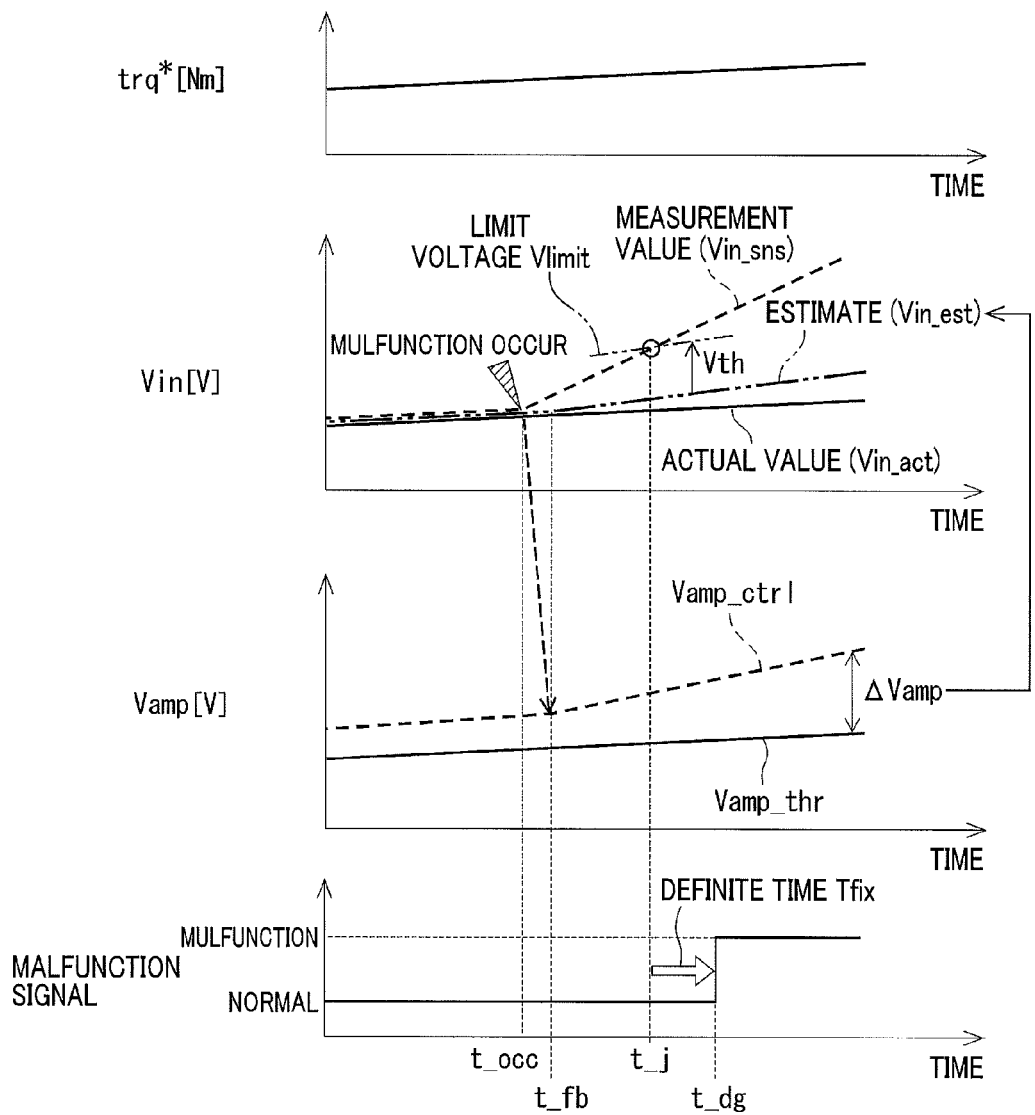
FIG. 6 is a timing chart schematically illustrating how a request torque, an input-voltage measurement value, an actual input voltage, a control voltage-command amplitude, and a theoretical voltage-command amplitude change, and whether a malfunction signal is generated according to the first embodiment.

Next, the following describes an example of the malfunction diagnostic task of the input voltage sensor 5 with reference to a timing chart illustrated in FIG. 6.

FIG. 6 schematically illustrates, from up to bottom, (1) How the request torque trq* changes (2) How the input-voltage measurement value Vin_sns measured by the input voltage sensor 5

(3) How the actual input voltage Vin_act changes (4) How each of the control voltage-command amplitude Vamp_ctrl and the theoretical voltage-command amplitude Vamp_thr changes (5) Whether the malfunction signal is generated.

The example of the malfunction diagnostic task of the input voltage sensor 5 illustrated in FIG. 6 assumes that the rotational speed ω is approximately zero, and the request torque trq* is not zero and gradually increases. The gradual increasing of the request torque trq* represents that the output torque requested for the MG 80 gradually increases during the malfunction diagnostic task.

The control voltage-command amplitude Vamp_ctrl is higher than the theoretical voltage-command amplitude Vamp_thr, because the dead time DT is used for the duty factor Duty for each switching element. In accordance with the equation [6.2], the input-voltage estimate Vin_est is calculated based on the voltage-command amplitude deviation ΔVamp, which represents the deviation obtained by subtracting the theoretical voltage-command amplitude Vamp_thr from the control voltage-command amplitude Vamp_ctrl.

A limit voltage Vlimit, which is obtained by offsetting the input-voltage estimate Vin_est by the voltage threshold Vth, is illustrated by the narrow two-dot chain line; the input-voltage estimate Vin_est is in contrast illustrated by the heavy two-dot chain line.

FIG. 6 for example illustrates the upper limit voltage Vlimit, which is obtained by offsetting upward the input-voltage estimate Vin_est by the voltage threshold Vth. As unillustrated in FIG. 6, a lower limit voltage, which is obtained by offsetting downward the input-voltage estimate Vin_est by the voltage threshold Vth is defined.

That is, the range between the upper limit voltage Vlimit and the lower limit voltage inclusive represents a normal range of the input voltage sensor 5. In other words, the normal range of the input voltage sensor 5 is defined as being when the absolute value of the difference between the input-voltage estimate Vin_est and the input-voltage measurement value Vin_sns is equal to or lower than the voltage threshold Vth.

In FIG. 6, before the occurrence of a malfunction, the input voltage sensor 5 is normal, so that the input-voltage measurement value Vin_sns, the actual input voltage Vin_act, and the input-voltage estimate Vin_est increase while being in agreement with each other. The control voltage-command amplitude Vamp_ctrl and the theoretical voltage-command amplitude Vamp_thr also slightly increase while maintaining the predetermined ratio therebetween.

Thereafter, a malfunction occurs in the input voltage sensor 5 at time t_occ during a present cycle of the current-feedback control task. The example of the malfunction diagnostic task of the input voltage sensor 5 illustrated in FIG. 6 assumes that there is a malfunction, which causes the input-voltage measurement value Vin_sns to be higher than the actual input voltage Vin_act.

After the occurrence of a malfunction at the time t_occ, the rate of increase of the input-voltage measurement value Vin_sns is greater than the rate of increase of the actual input voltage Vin_act.

Referring to the reference numeral #1 in FIG. 5, an increase of the input-voltage measurement value Vin_sns, which constitutes the denominator of the equation [A], results in a decrease of the duty factor Duty. The decrease of the duty factor Duty causes the currents flowing into the MG 80 to decrease. This causes the d-and q-axis control voltage commands Vd* and Vq* to increase by execution of the next cycle of the current-feedback control task at time t_fb.

Referring to the reference numeral #2 in FIG. 5, an increase of the d-and q-axis control voltage commands Vd* and Vq* results in an increase of the control voltage-command amplitude Vamp_ctrl, resulting in an increase of the rate of increase of the control voltage-command amplitude Vamp_ctrl. In contrast, the rate of increase of the theoretical voltage-command amplitude Vamp_thr, which is independent from the current-feedback control task, is maintained unchanged. Thus, the control voltage-command amplitude Vamp_ctrl gradually deviates from the theoretical voltage-command amplitude Vamp_thr after the execution of the next cycle of the current-feedback control task at time t_fb.

This leads to an increase of the input-voltage estimate Vin_est. The amount of an increase of the input-voltage estimate Vin_est is smaller than the amount of an increase of the input-voltage measurement value Vin_sns. This causes the deviation of the input-voltage estimate Vin_est from the input-voltage estimate Vin_est to increase. Thereafter, when the absolute value of the difference between the input-voltage estimate Vin_est and the input-voltage estimate Vin_est exceeds the voltage threshold Vth at time t_j, it is determined that there is a malfunction in the input voltage sensor 5. When the abnormal state that the absolute value of the difference between the input-voltage estimate Vin_est and the input-voltage estimate Vin_est exceeds the voltage threshold Vth has continued for a predetermined definite time Tfix since the time t_j (see time t_dg), the determination that there is a malfunction in the input voltage sensor 5 is finalized. This results in the malfunction signal showing that there is a malfunction in the input voltage sensor 5 being generated.

On the other hand, when there is a malfunction, which causes the input-voltage measurement value Vin_sns to be lower than the actual input voltage Vin_act, the amount of a decrease of the input-voltage measurement value Vin_sns is greater than the amount of decrease of the input-voltage estimate Vin_est. Thereafter, when the absolute value of the difference between the input-voltage estimate Vin_est and the input-voltage estimate Vin_est exceeds the voltage threshold Vth, it is similarly determined that there is a malfunction in the input voltage sensor 5.

Figure 7:
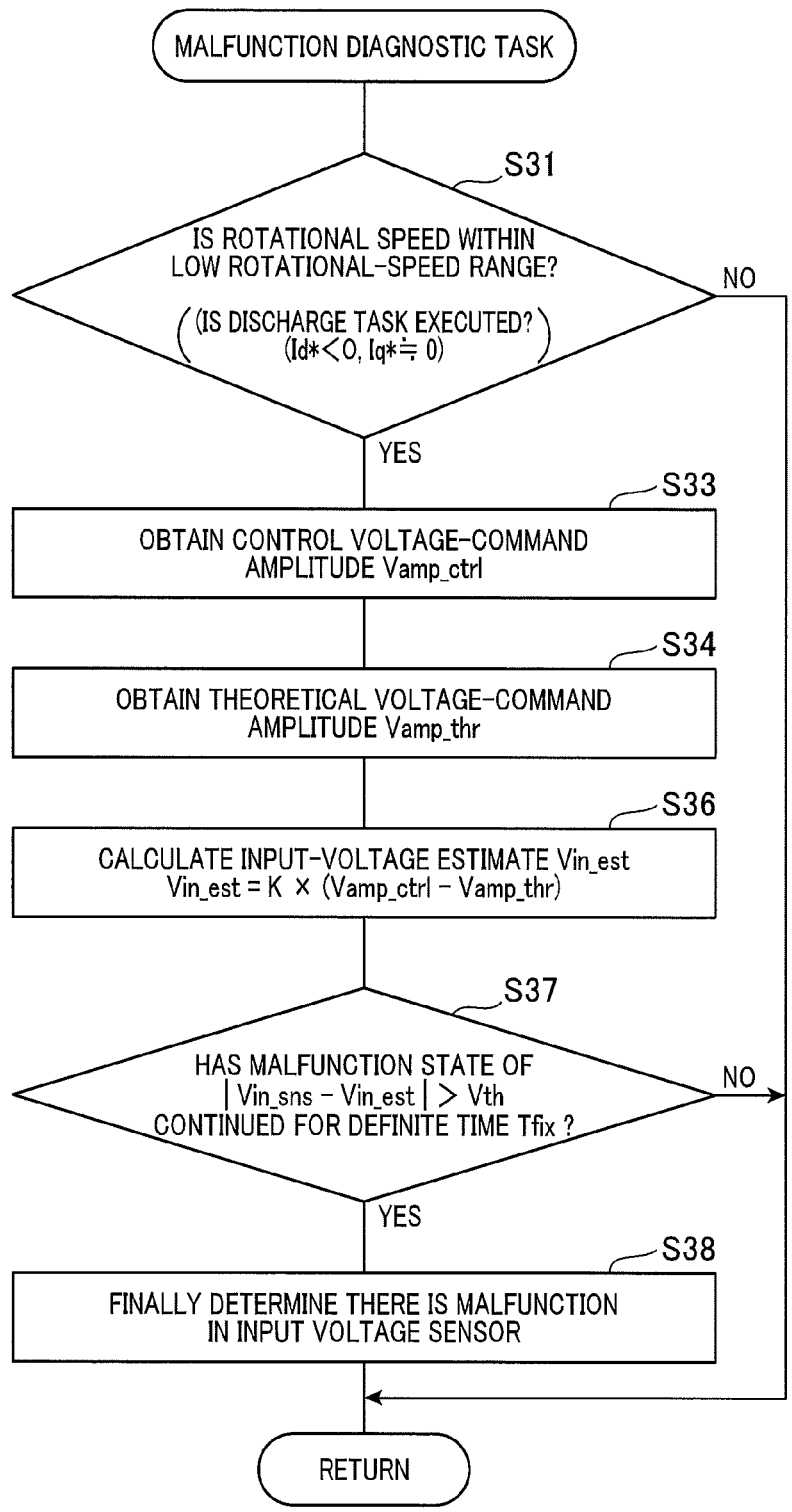
FIG. 7 is a flowchart schematically illustrating a malfunction diagnostic task carried out by the diagnostic device according to the first embodiment.
Figure 8:
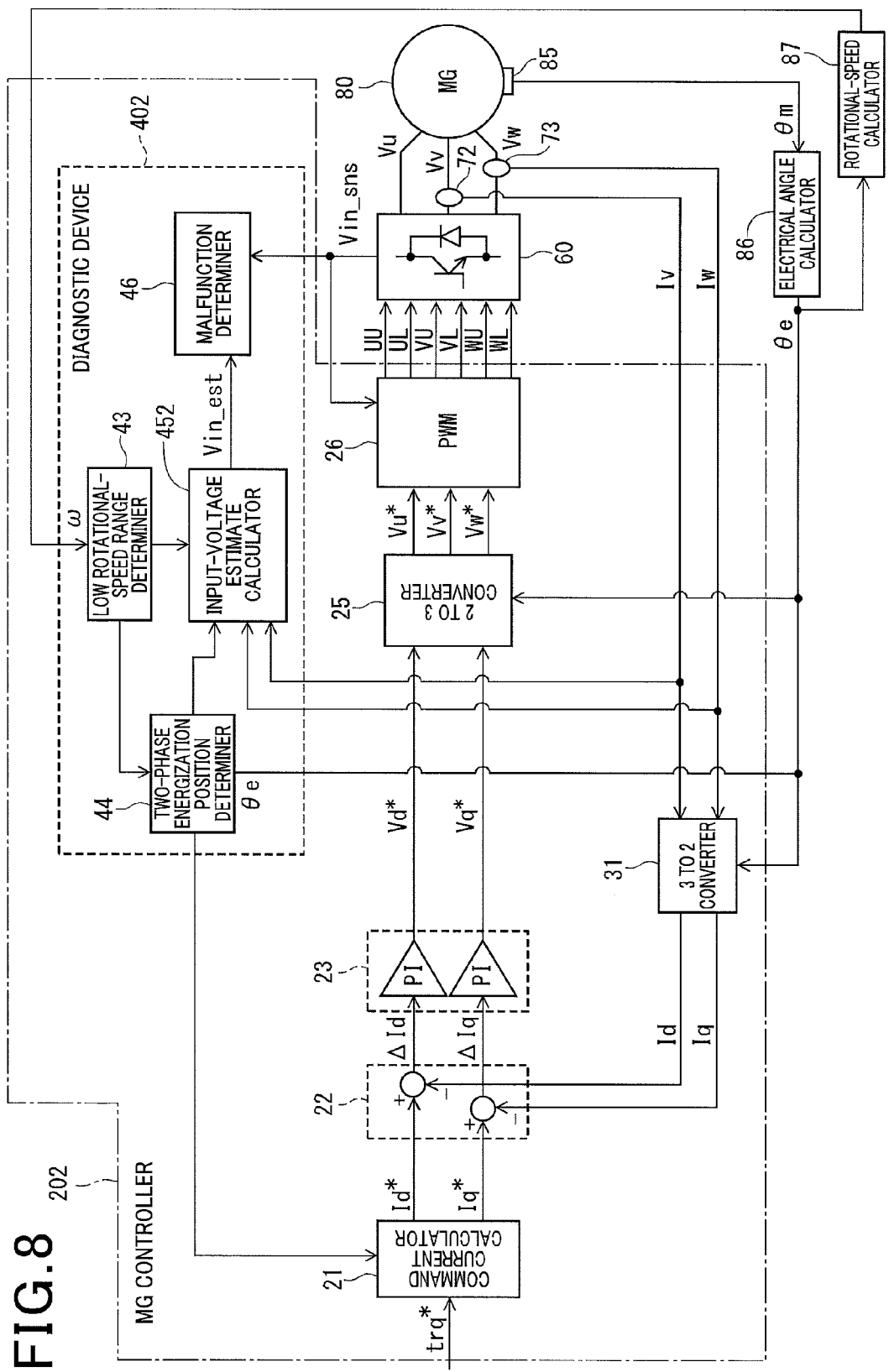
FIG. 8 is a block diagram schematically illustrating the structures of an MG controller and a diagnostic device according to the second embodiment of the present disclosure.

Next, the following describes the malfunction diagnostic task cyclically carried out by the diagnostic device 401 with reference to FIG. 7.

When starting the malfunction diagnostic task, the low rotational-speed range determiner 43 determines whether the actual rotational speed ω of the MG 80 is within the low rotational-speed range in step S31. Upon determining that the actual rotational speed ω of the MG 80 is out of the low rotational-speed range (NO in step S31), the rotational-speed range determiner 43 terminates the malfunction diagnostic task.

At that time, as illustrated in FIG. 1, the MG drive system 90 includes the power-source relay circuit 12 interposed between the battery 11 and the inverter 60. The MG controller 20 is operative to perform a discharge task that causes the power-source relay circuit 12 to shut off the supply of power from the battery 11 to the inverter 60, and thereafter causes the remaining charge in the capacitor 16 to be discharged by the MG 80 as heat.

While the MG controller 201 is performing the discharge task, the command current calculator 21 sets the d-axis current command Id* to a negative value, which is unequal to zero, and sets the q-axis current command Iq* to zero. Because of the q-axis current command Iq* being set to zero, no torque is generated by the MG 80, so that the rotational speed ω is approximately zero. Because of the d-axis current command Id* being a significant value unequal to zero, a significant value unequal to zero is calculated as each of the control voltage-command amplitude Vamp_ctrl and the theoretical voltage-command amplitude Vamp_thr.

In step S31, for example, the low rotational-speed range determiner 43 determines that the actual rotational speed ω of the MG 80 is within the low rotational-speed range when determining that the MG controller 201 is parallely executing the discharge task (YES in step S31). Then, the malfunction diagnostic task proceeds to steps S33 and S34.

The input-voltage estimate calculator 451 performs the operations in steps S33 and S34 in random order. Specifically, the input-voltage estimate calculator 451 obtains the control voltage-command amplitude Vamp_ctrl from the control voltage-command amplitude calculator 27 in step S33, and obtains the theoretical voltage-command amplitude Vamp_thr from the theoretical voltage-command amplitude calculator 28 in step S34.

Following the operations in steps S33 and S34, the input-voltage estimate calculator 451 calculates the input-voltage estimate Vin_est in accordance with the equation [6.2] in step S36.

Following the operation in step S36, the malfunction determiner 46 obtains the input-voltage measurement value Vin_sns from the input voltage sensor 5, and obtains the input-voltage estimate Vin_est from the input-voltage estimate calculator 451. Then, the malfunction determiner 46 determines whether the absolute value of the difference between the input-voltage measurement value Vin_sns and the input-voltage estimate Vin_est is higher than the voltage threshold Vth in step S37.

Upon determining that the absolute value of the difference between the input-voltage measurement value Vin_sns and the input-voltage estimate Vin_est is higher than the voltage threshold Vth, the malfunction determiner 46 tentatively determines that there is a malfunction in step S37.

In step S37, the malfunction determiner 46 determines whether the malfunction state that the absolute value of the difference between the input-voltage estimate Vin_est is higher than the voltage threshold Vth has continued for the predetermined definite time Tfix since the tentative determination in step S37.

Upon determining that the malfunction state has continued for the predetermined definite time Tfix since the tentative determination (YES in step S37), the malfunction determiner 46 finally determines that there is a malfunction in the input voltage sensor 5, thus generating the malfunction signal showing that there is a malfunction in the input voltage sensor 5 in step S38.

Otherwise, upon determining that the malfunction state has not continued for the predetermined definite time Tfix since the tentative determination (NO in step S37), the malfunction determiner 46 does not perform final determination that there is a malfunction in the input voltage sensor 5, terminating the malfunction diagnostic task. This is because there is a high probability that transient disturbance causes the input-voltage measurement value Vin_sns to deviate from the input-voltage estimate Vin_est.

Note that the detailed logic in step S37 for finally determining whether there is a malfunction in the input voltage sensor 5 can be freely determined. For example, in step S37, even if the malfunction state has not continued for the predetermined definite time Tfix since the tentative determination (NO in step S37), when the accumulated time for which it is determined that there is a malfunction in the input voltage sensor 5 has reached the predetermined definite time Tfix, the malfunction determiner 46 can finally determine that there is a malfunction in the input voltage sensor 5.

The following describes advantageous effects achieved by the MG controller 201 and/or the MG drive system 90.

The conventional technology disclosed in the conventional patent document described in the BACKGROUND calculates, as the first output estimate, the sum of the product of the U-phase current and the U-phase command voltage, the product of the V-phase current and the V-phase command voltage, and the product of the W-phase current and the W-phase command voltage.

In addition, the conventional technology disclosed in the conventional patent document calculates the product of request torque for the AC motor and the angular velocity of the AC motor to obtain the second output estimate accordingly.

Then, the conventional technology disclosed in the conventional patent document compares the first output estimate with the second output estimate to calculate the absolute value of the difference between the first and second output estimates. The diagnostic device determines that there is a malfunction in the inverter input-voltage sensor when the absolute value of the difference between the first and second output estimates is higher than a predetermined second value.

The conventional technology disclosed in the conventional patent document however may erroneously determine that there is a malfunction in the inverter input-voltage sensor if the rotational speed of the AC motor is within a low rotational-speed range. If the conventional technology disclosed in the conventional patent document is applied to a motor-generator drive system for hybrid vehicles or electric vehicles, the conventional technology can perform the diagnosis of the inverter input-voltage sensor only while the AC motor is operating in a high rotational-speed range based on a high voltage input to the inverter.

In contrast, when the rotational speed ω of the MG 80 is within the low rotational-speed range, the MG controller 201 according to the first embodiment is configured to 1. Calculate the input-voltage estimate Vin_est as a function of the control voltage-command amplitude Vamp_ctrl and the theoretical voltage-command amplitude Vamp_thr 2. Compare the input-voltage measurement value Vin_sns with the calculated input-voltage estimate Vin_est 3. Determine whether there is a malfunction in the input voltage sensor 5 based on the comparison results.

Because the percentage of the dead-time correction amount V_dead in the control voltage-command amplitude Vamp_ctrl in the low rotational-speed range is greater than the percentage of the dead-time correction amount V_dead in the control voltage-command amplitude Vamp_ctrl in a rotational-speed range higher than the low rotational-speed range, this configuration calculates the input-voltage estimate Vin_est with higher accuracy. This therefore prevents erroneous determination that there is a malfunction in the input voltage sensor 5.

The MG controller 201 according to the first embodiment is also configured to perform the diagnostic task only when the rotational speed ω of the MG 80 is within the low rotational-speed range. This configuration enables the dead-time correction amount V_dead to be previously determined by, for example, experiments and/or simulations. This therefore enables the transform coefficient K, which is used for calculating the input-voltage estimate Vin_est, to be set to a constant value based on the previously determined dead-time correction amount V_dead.

When the MG controller 201 is applied to the MG drive system 90 installed in a hybrid vehicle or an electrical vehicle, the MG controller 201 is capable of performing the malfunction diagnostic task of the input voltage sensor 5 when the corresponding vehicle is stopped or the MG 80 has just started up. This enables the corresponding vehicle to be maintained stopped when it is determined that there is a malfunction in the input voltage sensor 5, thus improving the safety of the corresponding vehicle.

The conventional technology disclosed in the conventional patent document compares the battery voltage measured by the battery voltage sensor with the inverter voltage measured by the inverter input-voltage sensor, and determines whether there is a malfunction in one of the battery voltage sensor and the inverter input-voltage sensor based on the comparison results.

In contrast, the MG controller 201 according to the first embodiment is configured to determine whether there is a malfunction in the input voltage sensor 5 without using a signal indicative of the DC voltage output from the battery 11 and a battery voltage sensor for measuring the DC voltage output from the battery 11. This enables the need to provide a battery voltage sensor and to provide an input of a signal, which is indicative of the DC voltage output from the battery 11, to the MG controller 201.

It is preferable that the MG controller 201 according to the first embodiment is configured to determine that the rotational speed ω of the MG 80 is within the low rotational-speed range when determining that the MG controller 20 is parallely executing the discharge task in step S31. This enables the malfunction diagnostic task to be installed in the existing routine for performing the discharge task. This therefore eliminates the need to provide an additional routine for performing the malfunction diagnostic task in the memory of the MG controller 201.

While the MG controller 201 is performing the discharge task, the command current calculator 21 is configured to set the d-axis current command Id* to a negative value, which is unequal to zero, and sets the q-axis current command Iq* to zero. This configuration enables the remaining charge in the capacitor 16 to be efficiently consumed while preventing the corresponding vehicle from unintentionally moving during execution of the discharge task.

Second Embodiment

Next, the following describes the structures of an MG controller 202 and a diagnostic device 402 according to the second embodiment.

The structures and/or functions of the MG controller 202 and diagnostic device 402 according to the second embodiment are different from those of the MG controller 201 and diagnostic device 401 according to the first embodiment by the following points. So, the following mainly describes the different points, and omits or simplifies descriptions of like parts between the first and second embodiments, to which identical or like reference characters are assigned, thus eliminating redundant descriptions.

The MG controller 202 includes no theoretical voltage-command calculator 24, control voltage-command amplitude calculator 27, and theoretical voltage-command amplitude calculator 28 as compared with the MG controller 201. The diagnostic device 402 further includes a two-phase energization position determiner 44 as compared with the structure of the diagnostic device 401. In particular, the diagnostic device 402 includes, in place of the input-voltage estimate calculator 451, an input-voltage estimate calculator 452. The input-voltage estimate calculator 452 obtains, in place of the control voltage-command amplitude Vamp_ctrl and the theoretical voltage-command amplitude Vamp_thr, the V- and W-phase currents Iv and Iw from the respective current sensors 72 and 73.

Figure 9A:
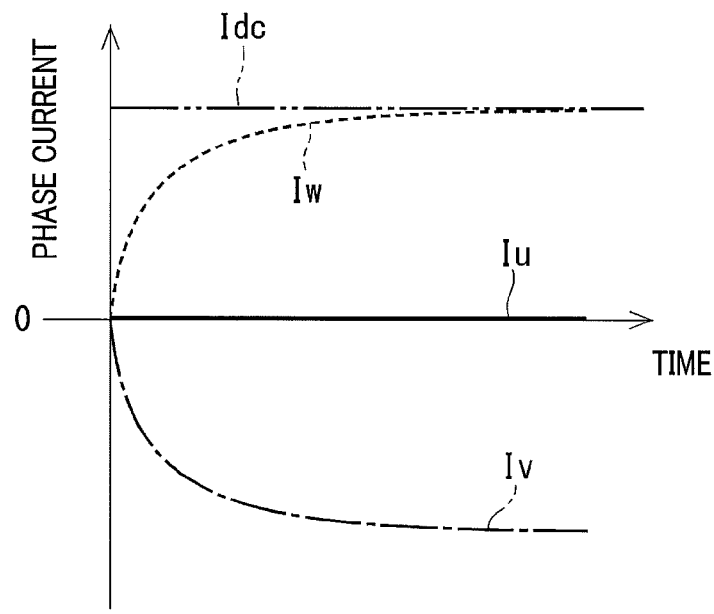
FIG. 9A is a graph schematically illustrating how U-, V-, and W-phase currents change when a current vector is perpendicular to a U-axis as an example of three axes U, V, and W according to the second embodiment.
Figure 9B:
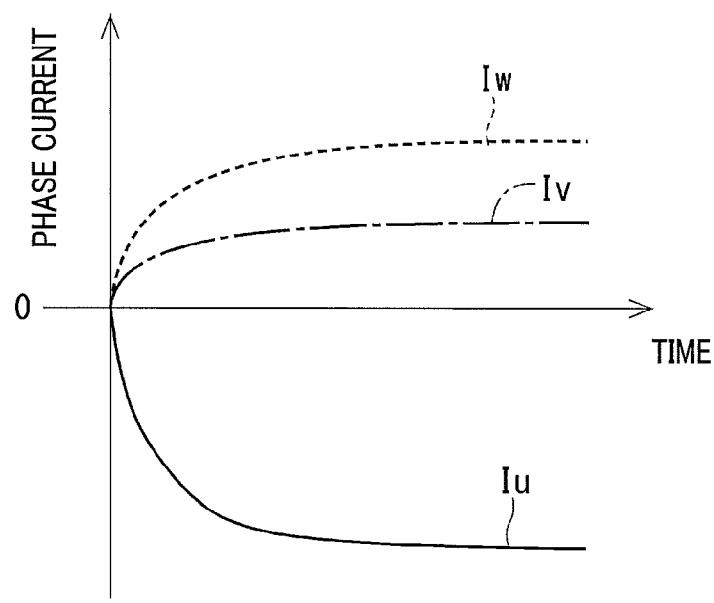
FIG. 9B is a graph schematically illustrating how the U-, V-, and W-phase currents change when the phase of the current vector is not perpendicular to each of the three axes U, V, and W according to the second embodiment.

First, the following describes two-phase energization positions in the low rotational-speed range of the MG 80 with reference to FIGS. 9A and 9B.

FIGS. 9A and 9B each illustrate how the U-, V-, and W-phase currents Iu, Iv, and Iw change when the U-, V-, and W-phase currents Iu, Iv, and Iw are supplied to flow in the MG 80 while the phase of the current vector based on the currents Iu, Iv, and Iw is constant during stop of rotation of the MG 80. After the supply of the U-, V-, and W-phase currents Iu, Iv, and Iw to the MG 80, each of the U-, V-, and W-phase currents Iu, Iv, and Iw converges to a constant DC value.

In particular, FIG. 9A illustrates how the U-, V-, and W-phase currents Iu, Iv, and Iw change when the current vector is perpendicular to the U-axis as an example of the three axes U, V, and W. In this case, the U-phase current Iu becomes zero (see FIG. 9A). FIG. 9B illustrates how the U-, V-, and W-phase currents Iu, Iv, and Iw change when the phase of the current vector is not perpendicular to each of the three axes U, V, and W. In this case, the three-phase currents Iu, Iv, and Iw each have a value unequal to zero flow in the MG 80.

The rotating position of the rotor of the MG 80 where one phase current in the three-phase currents is zero and the other two phase currents have values unequal to zero is defined as a two-phase energization position. The MG controller 202 according to the second embodiment calculates the U-phase current Iu based on to the V- and W-phase currents Iv and Iw in accordance with Kirchhoff's law in the same manner as the MG controller 201. That is, the two-phase energization position appears three times, i.e. appears every 120 electrical degrees, in each cycle, i.e. 360 electrical degrees, of the U-phase current Iu. Similarly, the two-phase energization position appears three times, i.e. appears every 120 electrical degrees, in each cycle, i.e. 360 electrical degrees, of the V-phase current Iv, and the two-phase energization position appears three times, i.e. appears every 120 electrical degrees, in each cycle, i.e. 360 electrical degrees, of the W-phase current Iw.

The two-phase energization position illustrated in FIG. 9A represents that (1) The polarity of one of the two phase currents Iv and Iw, which are not equal to zero, is reversed with respect to the polarity of the other thereof.

(2) The absolute value of one of the two phase currents Iv and Iw is equal to the absolute value of the other thereof.

The direct current Idc to which the absolute value of each of the positive phase current Iw and the negative phase current Iv illustrated in FIG. 9A converges is identical to a battery current output from the battery 11.

Specifically, when it is determined that the rotational speed ω of the MG 80 is within the low rotational-speed range, the two-phase energization position determiner 44 determines, based on the electrical angle θe of the MG 80, whether the actual rotating position of the MG 80 is located to one of the two-phase energization positions. Note that each of the two-phase energization positions is theoretically a single position, but each of the two-phase energization positions according to the second embodiment is actually defined as a predetermined small angular positional range, i.e. allowable range, including the corresponding one of the theoretical two-phase energization positions. This is because, even if the actual rotating position of the MG 80 is located to be slightly different from one of the theoretical two-phase energization positions due to an error, it is possible to determine that the actual rotating position of the MG 80 is located to the corresponding two-phase energization position as long as the actual rotating position of the MG 80 is located within the corresponding small angular positional range.

The two-phase energization position determiner 44 sends, to the input-voltage estimate calculator 452, the information representing that the actual rotating position of the MG 80 is located to one of the two-phase energization positions. In addition, the two-phase energization position determiner 44 sends, to the command current calculator 21, the information representing the actual rotating position of the MG 80 when determining that the actual rotating position of the MG 80 is not located at one of the two-phase energization positions.

When the information representing the actual rotating position of the MG 80 is sent thereto from the two-phase energization position determiner 44, the command current calculator 21 calculates, according to the difference of the actual rotating position of the MG 80 from the closest two-phase energization position, a value of the q-axis current command Iq*, which slightly rotates the MG 80 to the closest two-phase energization position. The slight rotational angle of the MG 80 can be set to be equal to or lower than +120 electrical degrees if the MG 80 is able to rotate in only the positive (+) direction. The slight rotational angle of the MG 80 can be set to be within the range from −60 electrical degrees to +60 electrical degrees inclusive if the MG 80 is able to rotate in both the positive (+) and negative (−) directions.

When the information representing that the actual rotating position of the MG 80 is located to one of the two-phase energization positions is sent thereto from the two-phase energization position determiner 44, the input-voltage estimate calculator 452 obtains the direct current Idc as illustrated in FIG. 9A based on the V- and W-phase currents Iv and Iw.

Figure 10:
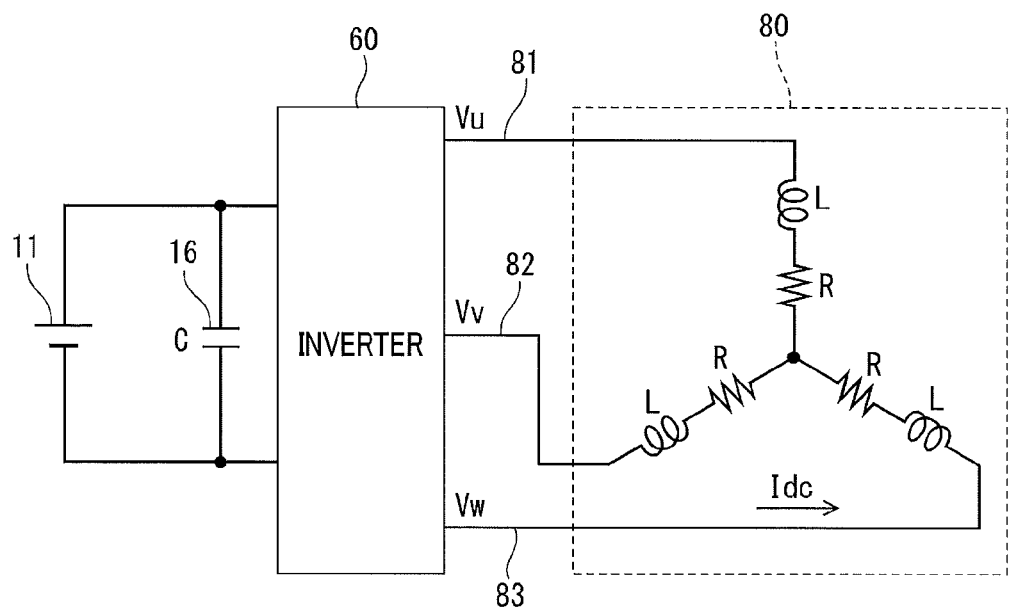
FIG. 10 is a circuit diagram schematically illustrating an RLC circuit including an MG and an inverter when the actual rotating position of the MG is located to one of two-phase energization positions according to the second embodiment.

FIG. 10 illustrates an RLC circuit including the MG 80 and the inverter 60 when the actual rotating position of the MG 80 is located to one of the two-phase energization positions. The resistance components R and the inductance components L of the RLC circuit are mainly caused by the resistance and inductance of the corresponding one of the U-, V-, and W-phase windings 81, 82, and 83. The capacitances C of the RLC circuit are caused by the capacitance of the capacitor 16, the junction capacitance of each switching element of the inverter 60, and other stray capacitances.

That is, the configuration of the RLC circuit when the actual rotating position of the MG 80 is located to one of the two-phase energization positions, is theoretically determined beforehand. An RLC circuit equation, which includes the direct current Idc, the resistances R, the inductances L, the capacitances C, and the input-voltage estimate Vin_est as variables, based on the configuration of the RLC circuit is therefore theoretically determined beforehand. In addition, the values of the resistances R, the values of the inductances L, and the values of the capacitances C are also previously determined based on, for example, experiments and/or simulations.

That is, the input-voltage estimate calculator 452 solves the predetermined RLC circuit equation for the input-voltage estimate Vin_est using the values of the resistances R, the values of the inductances L, and the values of the capacitances C.

Figure 11:
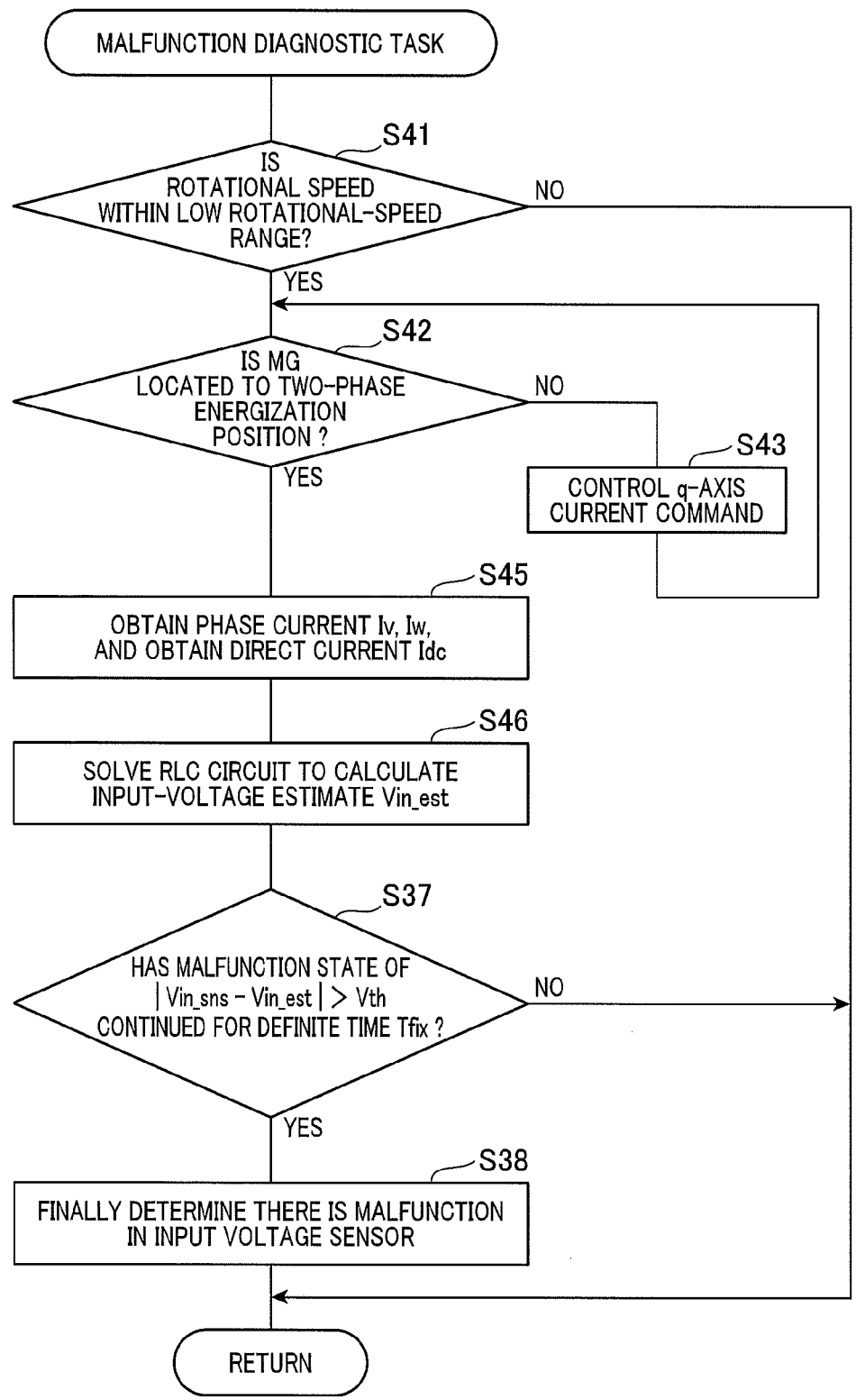
FIG. 11 is a flowchart schematically illustrating a malfunction diagnostic task carried out by the diagnostic device according to the second embodiment.

Next, the following describes a malfunction diagnostic task cyclically carried out by the diagnostic device 402 with reference to FIG. 11.

Note that, in FIGS. 7 and 11, like steps between the flowchart of FIG. 7 and the flowchart of FIG. 11, to which like step numbers are assigned, such as steps S37 and S38, are omitted or simplified in description to avoid redundant description.

When starting the malfunction diagnostic task, the low rotational-speed range determiner 43 determines whether the actual rotational speed ω of the MG 80 is within the low rotational-speed range in step S41. Upon determining that the actual rotational speed ω of the MG 80 is out of the low rotational-speed range (NO in step S41), the rotational-speed range determiner 43 terminates the malfunction diagnostic task.

Note that the low rotational-speed range determiner 43 is capable of performing the determination in step S41 during another task other than the discharge task. That is, the low rotational-speed range determiner 43 is capable of performing the malfunction diagnostic task according to the second embodiment while the actual rotational speed ω of the MG 80 is within the low rotational-speed range independently of whether the MG 80 generates torque.

Specifically, when it is determined that the actual rotational speed ω of the MG 80 is within the low rotational-speed range (YES in step S41), the two-phase energization position determiner 44 determines whether the actual rotational position of the MG 80 is located to one of the two-phase energization positions in step S42.

When it is determined that the actual rotational position of the MG 80 is located to one of the two-phase energization positions (YES in step S42), the malfunction diagnostic task proceeds to step S45.

Otherwise, when it is determined that the actual rotational position of the MG 80 is not located to one of the two-phase energization positions (NO in step S42), the malfunction diagnostic task proceeds to step S43.

In step S43, the diagnostic device 402 serves as a current controller that causes the command current calculator 21 of the MG controller 202 to calculate, according to the difference of the actual rotating position of the MG 80 from the closest two-phase energization position, a value of the q-axis current command Iq*, which slightly rotates the MG 80 to the closest two-phase energization position in step S43. After the operation in step S43, the two-phase energization position determiner 44 repeats the determination in step S42.

In step S45, the input-voltage estimate calculator 452 obtains the V- and W-phase currents Iv and Iw, and obtains the direct current Idc that is a converging value of each of the V- and W-phase currents Iv and Iw.

Following the operation in step S45, the input-voltage estimate calculator 452 solves the predetermined RLC circuit equation of the RLC circuit, which includes the inverter 60 and MG 80, for the input-voltage estimate Vin_est using the values of the resistances R, the values of the inductances L, and the values of the capacitances C in step S46, thus calculating the input-voltage estimate Vin_est.

After the operation in step S46, the diagnostic device 402 performs the operations in steps S37 and S38 as described in the first embodiment.

The above diagnostic device 402 of the MG controller 202 according to the second embodiment enables calculation of the input-voltage estimate Vin_est with higher accuracy like the first embodiment, thus preventing erroneous determination that there is a malfunction in the input voltage sensor 5.

Additionally, the diagnostic device 402 of the MG controller 202 according to the second embodiment is configured to calculate the input-voltage estimate Vin_est based on the direct current Idc obtained when the rotating position of the MG 80 is located to one of the two-phase energization positions. This configuration eliminates the need to use the dead-time correction amount V_dead for calculating the input-voltage estimate Vin_est.

The following describes other embodiments of the present disclosure.

FIG. 1 illustrates the MG drive system 90 equipped with the single MG 80, but the present disclosure can be applied to an MG drive system equipped with two or more MGs. Specifically, the present disclosure can be applied to series-parallel hybrid vehicles each is equipped with a first MG serving mainly as a power generator, and a second MG serving mainly as a motor. In this modification, a first inverter and a second inverter, which are operative to drive the respective first and second MGs, are connected to the battery 11 in parallel to each other. This enables the inverter input voltage Vin to be commonly input to both the first and second inverters. Thus, installing the diagnostic device 401 or 402 in at least one of the MG controllers for respectively controlling the first and second MGs enables the diagnostic device 401 or 402 to diagnose whether there is a malfunction in the input voltage sensor 5 in the same approach as the first or second embodiment.

Each of the diagnostic devices 401 and 402 is installed in the MG drive system 90 configured such that the output voltage of the battery 11 is directly input to the inverter 60, but the present disclosure is not limited thereto. Specifically, each of the diagnostic devices 401 and 402 can be installed in an MG drive system configured such that a booster converter is interposed between the battery 11 and the inverter 60. In this modification, the booster converter boosts the DC voltage output from the battery 11, and each of the diagnostic devices 401 and 402 is configured to diagnose whether there is a malfunction in the input voltage sensor 5 that measures the boosted DC voltage.

This modification equipped with the booster converter requires a battery voltage sensor, because control of the booster converter is carried out based on the DC voltage, which is measured by the battery voltage sensor, output from the battery 11. Each of the diagnostic devices 401 and 402 according to this modification however achieves the advantageous effect that the corresponding diagnostic device enables detection of whether there is a malfunction in the input voltage sensor 5 while the rotational speed of the MG 80 is in the low rotational-speed range to be carried out.

Each of the diagnostic devices 401 and 402 is installed in the MG drive system 90 for driving the MG 80, but can be installed in a motor drive system for driving a motor without including a function as a power generator. A permanent magnet synchronous three-phase AC motor is used as a motor controlled by each of the MG controller 201 and 202. However, the present disclosure is not limited to the configuration. Specifically, one of the other types of motors, such as an induction motor or a synchronous motor other than the permanent magnet synchronous three-phase AC motor, can be used as a motor controlled by each of the MG controller 201 and 202. Four or more phase AC motors can be used as a motor controlled by each of the MG controller 201 and 202.

Each of the diagnostic devices 401 and 402 can be installed in motor drive systems for various fields, such as machinery industries.

The theoretical voltage-command calculator 24 calculates the theoretical d- and q-axis voltage commands Vd_thr and Vq_thr based on the d- and q-axis current commands Id* and Iq* and the rotational speed ω in accordance with the voltage equations set forth above. Then, the theoretical voltage-command amplitude calculator 28 calculates the theoretical voltage-command amplitude Vamp_thr as a function of the theoretical d- and q-axis voltage commands Vd_thr and Vq_thr.

The theoretical voltage-command calculator 24 is however is not limited to the configuration.

Specifically, the theoretical voltage-command calculator 24 can calculate the theoretical three-phase voltage commands based on the following three-phase model equation [7] that is different from the voltage equations:

$$\begin{bmatrix} Vu \\ Vv \\ Vw \end{bmatrix} = \begin{bmatrix} R+pLu & pMuv & pMwu \\ pMuv & R+pLv & pMvw \\ pMwu & pMvw & R+pLw \end{bmatrix} \cdot \begin{bmatrix} Iu \\ Iv \\ Iw \end{bmatrix} - \omega\phi \begin{bmatrix} \sin\theta e \\ \sin\left(\theta e - \frac{2\pi}{3}\right) \\ \sin\left(\theta e + \frac{2\pi}{3}\right) \end{bmatrix}. \quad [7]$$

Where
(1) p represents a differential operator
(2) R represents the resistance of each-phase winding
(3) L represents a self-inductance
(4) M represents a mutual inductance
(5) ω represents an angular velocity or rotational speed
(6) φ represents a back-emf constant.

Note that a subscript to the right of each L represents the corresponding phase. For example, Lu represents the self-inductance of the U-phase winding. Similarly, a subscript to the right of each M represents the corresponding phase-to-phase. For example, Muv represents the mutual inductance between the U- and V-phase windings.

The theoretical voltage-command calculator 24 can calculate the theoretical d- and q-axis voltage commands Vd_thr and Vq_thr based on a map indicative of the relationship based on the voltage equations, or calculate the theoretical three-phase voltage commands based on a map indicative of the relationship based on the three-phase model equation.

The switching signals for driving, i.e. turning on or off the respective switching elements 61 to 66 of the inverter 60 are not limited to the PWM pulse signals generated by comparison for each switching element between the corresponding duty factor Duty and the carrier signal. Specifically, for the upper- and lower-arm switching elements of each phase, signals that complementarily turn on the upper- and lower-arm switching elements for each switching period Tsw can be used as the switching signals for the upper- and lower-arm switching elements.

For example, a plurality of pulse patterns each within one cycle, i.e. 360 electrical degrees, of the MG 80 are prepared to be stored in the memory of the MG controller 20. That is, the MG controller 20 selects one of the pulse patterns for a target switching element from the plurality of pulse patterns at an actual switching cycle Tsw; the selected pulse pattern is suitable for the modulation factor M. Then, the MG controller 20 controls on-off operations of the target switching element based on the selected pulse pattern in synchronization with the actual switching cycle Tsw.

The selected pulse patterns selected for the upper- and lower-arm switching elements for each phase are configured to complementarily turn on the upper- and lower-arm switching elements while providing the dead times DT to prevent the upper- and lower-arm switching elements from being simultaneously turned on.

Thus, even if the pulse patterns are used in place of the switching signals, the MG controller 20 can diagnose whether there is a malfunction in the input voltage sensor 5 according to each of the first and second embodiments.

The MG controller 201 or 202, which incorporates the diagnostic device 401, is installed in the MG drive system installed in, for example, a hybrid vehicle. On the condition that the MG drive system is installed in a hybrid vehicle or an electrical vehicle, the diagnostic device 401 or 402 determines whether the actual rotational speed ω of the MG 80 is within the low rotational-speed range based on determination of whether the MG controller 201 is parallely executing the discharge task in step S31. The present disclosure is however not limited to the determination.

Specifically, on the condition that the MG drive system is installed in a hybrid vehicle or an electrical vehicle, the diagnostic device 401 or 402 can determine whether the actual rotational speed ω of the MG 80 is within the low rotational-speed range based on determination of whether the MG controller 201 or 202 is parallely executing a relay-contact welding checking routine after startup of the corresponding vehicle. Note that in this modification, the power-source relay circuit 12 includes system main relays connecting between the battery 11 and the inverter 12.

That is, the relay-contact welding checking routine causes the system main relays of the power-source relay circuit 12 to be shut off, and thereafter, checks whether the relay contacts of each of the system main relays are welded to each other while the rotational speed ω of the MG 80 is set to be approximately zero. The specific procedures for checking whether the relay contacts of each of the system main relays are welded to each other are disclosed in Japanese Patent Application Publication No. 2015-162977. The disclosure of Japanese Patent Application Publication No. 2015-162977 is incorporated in its entirely herein by reference.

This modification, which performs the diagnosis of the input voltage sensor 5 during execution of the relay-contact welding checking routine, enables the diagnostic device 401 or 402 to performs the diagnosis of the input voltage sensor 5 reliably before the generation of torque by the MG 80 immediately after startup of the corresponding vehicle.

Note that it is preferable that, in the second embodiment, the values of the circuit constants (resistances R, the inductances L, and capacitances C) are corrected based on their temperature characteristics and the difference in temperature between an atmosphere temperature around the corresponding vehicle and the temperature of the MG 80. In this point, the diagnostic device 402 according to this modification enables the corrections of the values of the circuit constants (resistances R, the inductances L, and capacitances C) in their temperature characteristics to be eliminated. This is because the temperature of the MG 80 is close to atmospheric temperature around the corresponding vehicle immediately after startup of the corresponding vehicle.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A diagnostic device applied to a motor controller that controls AC power, supplied from an inverter based on a DC voltage of a DC power source, to a multiphase AC motor having three or more phases, the diagnostic device being operative to diagnose whether there is a malfunction in an input voltage sensor that measures, as an input-voltage measurement value, an input voltage to the inverter, the diagnostic device comprising:

a determiner configured to determine whether a rotational speed of the AC motor is within a predetermined low rotational-speed range in which the rotational speed is approximately zero;

an input-voltage estimate calculator configured to calculate, as an input-voltage estimate, an estimate of the input voltage to the inverter when it is determined that the rotational speed of the AC motor is within the predetermined low rotational-speed range; and a malfunction determiner configured to perform a diagnostic task that:

calculates an absolute value of a difference between the input-voltage measurement value measured by the input voltage sensor and the input-voltage estimate;

determines whether the absolute value of the difference is higher than a predetermined voltage threshold; and determines that there is a malfunction in the input voltage sensor upon determining that the absolute value of the difference is higher than the predetermined voltage threshold.

2. The diagnostic device according to claim 1, wherein:

the inverter comprises plural pairs of upper- and lower-arm switching elements;

the motor controller is configured to:

perform a current-feedback control task based on phase currents fed back from the alternating-current motor to calculate a control voltage command having a first amplitude; and calculate, based on the control voltage command, a switching signal that complementarily turn on the upper- and lower-at n switching element of each pair for each switching period while a dead time is provided between on durations of the upper- and lower-arm switching elements of each pair, the motor-controller being configured to correct the first amplitude of the control voltage command based on a correction amount that depends on the dead time; and the input-voltage estimate calculator is configured to:

obtain a second amplitude of a theoretical voltage command in accordance with a motor model equation;

subtract the second amplitude of the theoretical voltage command from the first amplitude of the control voltage command to obtain a voltage-command deviation; and multiply the voltage-command deviation by a predetermined transform coefficient to thereby calculate the input-voltage estimate.

3. The diagnostic device according to claim 2, wherein:
the AC motor is a three-phase AC motor, so that the phase currents fed back from the three-phase AC motor are three-phase currents;
the current-feedback control task converts the three-phase currents into a d-axis current in a d-axis of a d-q coordinate system of the three-phase AC motor and a q-axis current in a q-axis current of the d-q coordinate system, the d-axis corresponding to a magnetic flux of the three-phase AC motor, the q-axis being electromagnetically perpendicular to the d-axis,
the current-feedback control task controlling a d-axis voltage command and a q-axis voltage command for the three-phase AC motor so as to converge a d-axis current deviation of the d-axis current from a d-axis current command and a q-axis current deviation of the q-axis current from a q-axis current command to zero; and
the motor model equation is a voltage equation that calculates a d-axis voltage and a q-axis voltage based on the d-axis current and the q-axis current and an electrical angular velocity of the three-phase AC motor.

4. The diagnostic device according to claim 3, wherein:
the malfunction determiner is configured to perform the diagnostic task when:
it is determined that the rotational speed of the three-phase AC motor is within the predetermined low rotational-speed range; and
at least one of the d-axis current command and the q-axis current command is unequal to zero.

5. The diagnostic device according to claim 4, wherein:
the malfunction determiner is configured to perform the diagnostic task when:
it is determined that the rotational speed of the three-phase AC motor is within the predetermined low rotational-speed range;
the d-axis current command is unequal to zero; and
the q-axis current command is equal to zero.

6. The diagnostic device according to claim 5, wherein:
the inverter includes a capacitor between an input side of the inverter and the DC power source;
the motor controller is capable of interrupting supply of the DC voltage of the DC power source to the inverter; and
the motor controller perform a discharge task that:
interrupts the supply of the DC voltage of the DC power source to the inverter; and
causes a remaining charge in the capacitor to be discharged by the three-phase AC motor as heat; and
the malfunction determiner is configured to perform the diagnostic task while the motor controller is performing the discharge task.

7. The diagnostic device according to claim 1, wherein:
the AC motor is a three-phase AC motor, so that three-phase currents flow in the three-phase AC motor,
a rotating position of the three-phase AC motor being capable of locating to one of two-phase energization positions in each of which one of the three-phase currents is zero, and the other two-phase currents are unequal to zero while the rotational speed of the three-phase AC motor is within the predetermined low rotational-speed range; and
the input-voltage estimate calculator is configured to, when the rotating position of the three-phase AC motor is located to one of the two-phase energization positions, calculate the input-voltage estimate based on:
a direct current based on the other two-phase currents;
resistance components of a circuit including the inverter and the three-phase AC motor;
inductance components of the circuit; and
capacitance components of the circuit.

8. The diagnostic device according to claim 7, wherein:
the motor controller is configured to perform a current-feedback control task based on the three-phase currents fed back from the three-phase AC motor,
the current-feedback control task converting the three-phase currents into a d-axis current in a d-axis of a d-q coordinate system of the three-phase AC motor and a q-axis current in a q-axis current of the d-q coordinate system,
the d-axis corresponding to a magnetic flux of the three-phase AC motor,
the q-axis being electromagnetically perpendicular to the d-axis,
the current-feedback control task controlling a d-axis voltage command and a q-axis voltage command so as to converge a d-axis current deviation of the d-axis current from a d-axis current command and a q-axis current deviation of the q-axis current from a q-axis current command to zero,
the diagnostic device further comprising:
a current control unit configured to, when the rotating position of the three-phase AC motor is different from each of the two-phase energization positions, cause the motor controller to set the q-axis current command to a value,
the value of the q-axis current command causing the three-phase AC motor to generate torque that rotates the rotating position of the three-phase AC motor to one of the two-phase energization positions.

* * * * *